(12) United States Patent
Kuo

(10) Patent No.: US 7,512,012 B2
(45) Date of Patent: Mar. 31, 2009

(54) NON-VOLATILE MEMORY AND MANUFACTURING METHOD AND OPERATING METHOD THEREOF AND CIRCUIT SYSTEM INCLUDING THE NON-VOLATILE MEMORY

(75) Inventor: Ming-Chang Kuo, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 183 days.

(21) Appl. No.: 11/742,345

(22) Filed: Apr. 30, 2007

(65) Prior Publication Data

US 2008/0266960 A1 Oct. 30, 2008

(51) Int. Cl.
*G11C 16/04* (2006.01)

(52) U.S. Cl. .............................. 365/185.26; 365/185.12; 365/185.1; 365/185.01; 365/185.18; 257/314; 257/315; 257/318; 257/E21.409; 257/E29.226; 438/257

(58) Field of Classification Search ............ 365/185.12, 365/185.26, 185.18, 185.01, 185.1; 257/314, 257/315, 318, E21.409, E29.226; 438/257
See application file for complete search history.

(56) References Cited

U.S. PATENT DOCUMENTS

| 6,011,725 A | 1/2000 | Eitan |
| 6,946,703 B2 * | 9/2005 | Ryu et al. ................. 257/315 |
| 2004/0207002 A1 * | 10/2004 | Ryu et al. ................. 257/315 |

* cited by examiner

*Primary Examiner*—Pho M. Luu
*Assistant Examiner*—Eric Wendler
(74) *Attorney, Agent, or Firm*—J.C. Patents

(57) ABSTRACT

The memory cell includes a first unit, a semiconductor layer, a second unit, and a doped region. The first unit includes a first gate, a first charge trapping layer, and a second charge trapping layer. The first and the second charge trapping layer are respectively disposed on both sides of the first gate. The semiconductor layer is disposed on the first unit. The second unit is disposed on the semiconductor layer and is in mirror symmetry to the first unit. The second unit includes a second gate and a third and a fourth charge trapping layer respectively disposed on both sides of the second gate. The doped region is disposed at both sides of the semiconductor layer and serves as a common source/drain region of both the first and the second unit.

53 Claims, 16 Drawing Sheets

NON-VOLATILE MEMORY AND MANUFACTURING METHOD AND OPERATING METHOD THEREOF AND CIRCUIT SYSTEM INCLUDING THE NON-VOLATILE MEMORY

BACKGROUND OF THE INVENTION

1. Field of the Invention

The present invention relates to a semiconductor device and a manufacturing method and an operating method thereof. More particularly, the present invention relates to a non-volatile memory and a manufacturing method and an operating method thereof.

2. Description of Related Art

Data can be written into and read or erased from an electrically erasable programmable read-only memory (EEPROM) repeatedly and the data stored in the EEPROM won't be lost even after the power is cut off. Thus, EEPRM among non-volatile memories has been broadly applied to personal computers and electronic equipments.

Typically, the floating gate and control gate of an EEPROM are fabricated with doped polysilicon, and the insulation layers between gates and the substrate and between gate and gate are silicon oxide layers.

However, a plurality of polysilicon layers and a plurality of silicon oxide layers are to be formed in the foregoing EEPROM. Thus, a plurality of mask processes has to be performed during the fabricating process, which not only prolongs the fabricating process but also increases the fabricating cost. Moreover, a memory cell in the EEPROM can only store a 1-bit data and the double-gate design also takes a lot of space, which are very disadvantageous to device integration.

Memories with nitride charge trapping layers have been provided later on. According to the memory cell structure, charges are trapped in a silicon nitride dielectric layer for storing data. Even though the memory with nitride charge trapping layer can store 2-bit data in a single memory cell, the 2 data bits may affect each other and which reduces the reliability of the memory. Moreover, it cannot provide good charge endurance. Hence, a non-volatile memory having high integration and high reliability is required.

SUMMARY OF THE INVENTION

Accordingly, the present invention is directed to a non-volatile memory which allows multi-bit data to be stored in a single memory cell.

According to another aspect of the present invention, a manufacturing method of a non-volatile memory is provided, wherein the non-volatile memory which can store multi-bit data in a single memory cell is manufactured through several self alignments.

According to yet another aspect of the present invention, an operating method of a non-volatile memory is provided for operating multi-bits in a single memory cell.

The present invention provides a non-volatile memory which includes a memory cell disposed on a substrate. The memory cell includes a first unit, a semiconductor layer, a second unit, and a doped region. The first unit includes a first gate, a first charge trapping layer, and a second charge trapping layer. The first and the second charge trapping layer are respectively disposed at two sides of the first gate. The semiconductor layer is disposed on the substrate and covers the first unit, and the lateral dimension of the semiconductor layer is greater than the lateral dimension of the first unit. The second unit is disposed on the semiconductor layer and is in mirror symmetry to the first unit with the semiconductor layer as the symmetry axis. The second unit includes a second gate disposed on the semiconductor layer, a third charge trapping layer, and a fourth charge trapping layer, wherein the third and the fourth charge trapping layer are respectively disposed at two sides of the second gate. The doped region is disposed in both sides of the semiconductor layer and is used for a common source/drain region of both the first and the second unit.

According to the non-volatile memory in an embodiment of the present invention, the material of the first, the second, the third, and the fourth charge trapping layer includes nanocrystal, tantalum oxide, strontium titanate, or hafnium oxide.

According to the non-volatile memory in an embodiment of the present invention, the material of the first, the second, the third, and the fourth charge trapping layer includes silicon nitride.

According to the non-volatile memory in an embodiment of the present invention, the material of the first, the second, the third, and the fourth charge trapping layer includes silicon oxide/silicon nitride/silicon oxide (ONO) composite material.

According to the non-volatile memory in an embodiment of the present invention, the first unit is disposed in the substrate, and a passivation layer is disposed between the first unit and the substrate.

According to the non-volatile memory in an embodiment of the present invention, a dielectric layer is disposed on the substrate, and the first unit is disposed in the dielectric layer.

According to an embodiment of the present invention, the non-volatile memory further includes a plurality of memory cells arranged as a column/row array on the substrate.

According to the non-volatile memory in an embodiment of the present invention, the memory cells in the same column are disposed adjacently in mirror symmetry.

According to the non-volatile memory in an embodiment of the present invention, any two adjacent memory cells disposed in mirror symmetry share a doped region.

According to an embodiment of the present invention, the non-volatile memory further includes a plurality of bottom word lines, a plurality of top word lines, and a plurality of bit lines. The bottom word lines are arranged in parallel in the direction of columns and connect the first gates of the memory cells in the same columns; the top word lines are arranged in parallel in the direction of columns and connect the second gates of the memory cells in the same columns; and the bit lines are arranged in parallel in the direction of rows and connect the doped regions of the memory cells in the same rows.

According to an embodiment of the present invention, the non-volatile memory further includes a tunneling dielectric layer respectively disposed between the first unit and the semiconductor layer, and between the second unit and the semiconductor layer.

According to an embodiment of the present invention, the tunneling dielectric layer includes a multi-layer structure.

According to an embodiment of the present invention, the multi-layer structure is a composite material of a bottom layer of silicon oxide/a middle layer of silicon nitride/a top layer of silicon oxide (ONO).

According to an embodiment of the present invention, the thickness of the bottom layer of silicon oxide in the composite material is less than 2 nm, such as between about 0.5~2 nm, or less than 1.5 nm.

According to an embodiment of the present invention, the thickness of the middle layer of silicon nitride in the composite material is less than 2 nm, such as between about 1~2 nm.

According to an embodiment of the present invention, the thickness of the top layer of silicon oxide in the composite material is less than 2 nm, such as between about 1.5~2 nm.

The present invention provides a manufacturing method of a non-volatile memory. According to the method, a substrate is provided first. An insulation layer and a bottom conductive layer are sequentially formed on the substrate. A first dielectric layer having a first opening for exposing the bottom conductive layer is then formed on the substrate. Next, a first unit is formed in the first opening. The first unit includes a first and a second charge trapping layer respectively formed on two sidewalls of the first opening, and a first gate filled in the first opening and electrically connected to the bottom conductive layer. After that, a second dielectric layer having a second opening for exposing the first unit is formed on the substrate. Thereafter, a third dielectric layer is formed in the second opening to cover the first unit. A semiconductor layer is further formed in the second opening to cover the first unit, and the lateral dimension of the semiconductor layer is greater than that of the first unit. Next, a second unit is formed on the semiconductor layer. The second unit includes a second gate formed on the semiconductor layer, and a third and a fourth charge trapping layer respectively formed at both sides of the second gates. A doped region is then formed in both sides of the semiconductor layer.

According to the manufacturing method of a non-volatile memory in an embodiment of the present invention, the substrate has a recess, and the insulation layer and the bottom conductive layer are sequentially formed in the recess to fill up the recess.

According to the manufacturing method of a non-volatile memory in an embodiment of the present invention, the method for forming the first unit may include following steps. First, a charge trapping material layer is formed in the opening. Portion of the charge trapping material layer is then removed to form the first and the second charge trapping layer on two sidewalls of the opening and to expose portion of the bottom conductive layer. Next, the first gate is filled in the opening and is connected to the bottom conductive layer.

According to an embodiment of the present invention, the manufacturing method of a non-volatile memory further includes a step of forming a dielectric layer on the inner walls of the first and the second charge trapping layer before the step of forming the first gate.

According to the manufacturing method of a non-volatile memory in an embodiment of the present invention, the method for forming the second unit may include following steps. First, the second gate is formed on the substrate. A charge trapping material layer is then formed on the substrate. Next, portion of the charge trapping material layer is removed to respectively form the third and the fourth charge trapping layer at both sides of the second gate.

According to an embodiment of the present invention, the manufacturing method of a non-volatile memory further includes a step of forming a tunneling dielectric layer on the semiconductor layer before the step of forming the second gate.

According to an embodiment of the present invention, the manufacturing method of a non-volatile memory further includes a step of forming a dielectric layer at both sides of the second gate before the step of forming the third and the fourth charge trapping layer.

According to the manufacturing method of a non-volatile memory in an embodiment of the present invention, the formation method of the semiconductor layer includes epitaxial lateral overgrowth.

According to the manufacturing method of a non-volatile memory in an embodiment of the present invention, the method for sequentially forming the insulation layer and the bottom conductive layer in the recess to fill up the recess may include following steps. First, an insulation material layer and a conductor material layer are formed in sequence on the substrate. Next, portion of the insulation material layer and portion of the conductor material layer are removed through chemical mechanical polishing with the substrate as the stop layer.

According to the manufacturing method of a non-volatile memory in an embodiment of the present invention, the material of the first, the second, the third, and the fourth charge trapping layer includes nanocrystal, tantalum oxide, strontium titanate, or hafnium oxide.

According to the manufacturing method of a non-volatile memory in an embodiment of the present invention, the material of the first, the second, the third, and the fourth charge trapping layer includes silicon nitride.

According to the manufacturing method of a non-volatile memory in an embodiment of the present invention, the material of the first, the second, the third, and the fourth charge trapping layer includes silicon oxide/silicon nitride/silicon oxide (ONO) composite material.

According to an embodiment of the present invention, the manufacturing method of a non-volatile memory further includes a step of forming a top conductive layer on the second unit, wherein the top conductive layer is electrically connected to the second gate.

The present invention further provides an operating method of a non-volatile memory which is suitable for a memory cell disposed on a substrate. The memory cell includes: a first unit having a first gate, a first charge trapping layer, and a second charge trapping layer, wherein the first and the second charge trapping layer are disposed at both sides of the first gate; a semiconductor layer covering the first unit; a second unit disposed on the semiconductor layer and being in mirror symmetry to the first unit with the semiconductor layer as the symmetry axis, wherein the second unit includes a second gate disposed on the semiconductor layer and a third and a fourth charge trapping layer disposed at both sides of the second gate; and a source region and a drain region respectively disposed in the semiconductor layer at both sides of the second unit and used as the common source region and common drain region of the first and the second unit. According to the operating method, while performing a program operation to the non-volatile memory, a first voltage is supplied to the first gate, a second voltage is supplied to the source region, a third voltage is supplied to the drain region, a fourth voltage is supplied to the second gate, and charges are injected into the first charge trapping layer, wherein the first voltage is higher than the second voltage, and the second voltage is higher than the third and the fourth voltage.

According to the operating method of a non-volatile memory in an embodiment of the present invention, the mechanism of performing the program operation includes channel hot electron injection.

According to the operating method of a non-volatile memory in an embodiment of the present invention, the first voltage is between 5V and 10V, the second voltage is between 3V and 6V, and the third and the fourth voltage are both 0V.

According to an embodiment of the present invention, the operating method of a non-volatile memory further includes while performing an erase operation to the non-volatile memory, supplying a fifth voltage to the first gate, supplying a sixth voltage to the source region, supplying a seventh voltage to the drain region, supplying an eighth voltage to the second gate, and erasing the charges in the first charge trapping layer, wherein the fifth voltage is lower than the sixth, the seventh and the eighth voltages, and the sixth voltage is higher than the seventh and the eighth voltages.

According to the operating method of a non-volatile memory in an embodiment of the present invention, the mechanism of performing the erase operation includes band-to-band hot hole (BTBHH) injection.

According to the operating method of a non-volatile memory in an embodiment of the present invention, the fifth is negative voltage and the sixth voltage is positive voltage. According to the operating method of a non-volatile memory in an embodiment of the present invention, the fifth voltage is between −5V and −10V, the sixth voltage is between +3V and +6V, and the seventh and the eighth voltage are both 0V.

According to an embodiment of the present invention, the operating method of a non-volatile memory further includes while performing a read operation to the non-volatile memory, supplying a ninth voltage to the first gate, supplying a tenth voltage to the source region, supplying an eleventh voltage to the drain region, supplying a twelfth voltage to the second gate, and reading the storage state of the first charge trapping layer, wherein the ninth voltage is higher than the eleventh voltage, and the eleventh voltage is higher than the tenth and the twelfth voltage.

According to the operating method of a non-volatile memory in an embodiment of the present invention, the mechanism of performing the read operation includes reverse reading.

According to the operating method of a non-volatile memory in an embodiment of the present invention, the ninth voltage is between 3V and 5V, the eleventh voltage is between 1V and 2V, and the tenth and twelfth voltage are both 0V.

According to an embodiment of the present invention, the operating method of a non-volatile memory further includes: while performing a program operation to the non-volatile memory, supplying the first voltage to the first gate structure, supplying the third voltage to the source region, supplying the second voltage to the drain region, supplying the fourth voltage to the second gate, and injecting charges into the second charge trapping layer through channel hot electron injection; while performing an erase operation to the non-volatile memory, supplying a fifth voltage to the first gate, supplying a seventh voltage to the source region, supplying a sixth voltage to the drain region, supplying an eighth voltage to the second gate, and erasing the charges in the second charge trapping layer through BTBHH injection; and while performing a read operation to the non-volatile memory, supplying a ninth voltage to the first gate, supplying an eleventh voltage to the source region, supplying a tenth voltage to the drain region, supplying a twelfth voltage to the second gate, and reading the storage state of the second charge trapping layer through reverse reading.

According to an embodiment of the present invention, the operating method of a non-volatile memory further includes: while performing a program operation to the non-volatile memory, supplying the fourth voltage to the first gate, supplying the second voltage to the source region, supplying the third voltage to the drain region, supplying the first voltage to the second gate, and injecting charges into the third charge trapping layer through channel hot electron injection; while performing an erase operation to the non-volatile memory, supplying an eighth voltage to the first gate, a sixth voltage to the source region, a seventh voltage to the drain, a fifth voltage to the second gate, and erasing the charges in the third charge trapping layer through BTBHH injection; and while performing a read operation to the non-volatile memory, supplying a twelfth voltage to the first gate, supplying a tenth voltage to the source region, supplying an eleventh voltage to the drain region, supplying a ninth voltage to the second gate, and reading the storage state of the third charge trapping layer through reverse reading.

According to an embodiment of the present invention, the operating method of a non-volatile memory further includes: while performing a program operation to the non-volatile memory, supplying the fourth voltage to the first gate, supplying the third voltage to the source region, supplying the second voltage to the drain region, supplying the first voltage to the second gate, and injecting electrons into the fourth charge trapping layer through channel hot electron injection, so as to store a fourth bit into the memory cell; while performing an erase operation to the non-volatile memory, supplying an eighth voltage to the first gate, supplying a seventh voltage to the source region, supplying a sixth voltage to the drain region, supplying a fifth voltage to the second gate, and erasing the electrons in the fourth charge trapping layer through BTBHH injection; and while performing a read operation to the non-volatile memory, supplying a twelfth voltage to the first gate, supplying an eleventh voltage to the source region, supplying a tenth voltage to the drain region, supplying a ninth voltage to the second gate, and reading the storage state of the fourth charge trapping layer through reverse reading.

The present invention further provides a circuit system, comprising a non-volatile memory and a circuit. The non-volatile memory comprises a plurality of memory cells, a plurality of word lines, and a plurality of bit lines. The memory cells are arranged as a column/row array, each memory cell comprises a first unit, a semiconductor layer, a second unit, and a doped region. The first unit comprises a first gate, and a first charge trapping layer and a second charge trapping layer respectively disposed at both sides of the first gate. The semiconductor layer is disposed on the substrate and covering the first unit, and the lateral dimension of the semiconductor layer is greater than the lateral dimension of the first unit. The second unit is disposed on the semiconductor layer, the second unit being in mirror symmetry to the first unit with the semiconductor layer as a symmetry axis, and the second unit comprises a second gate disposed on the semiconductor layer; and a third charge trapping layer and a fourth charge trapping layer, respectively disposed at both sides of the second gate. The doped region is disposed in both sides of the semiconductor layer and serving as a common source/drain region of both the first unit and the second unit. The plurality of words comprises a plurality of bottom word lines, arranged in parallel in a direction of the columns, for connecting the first gates of the memory cells in the same columns, and a plurality of top word lines, arranged in parallel in the direction of the columns, for connecting the second gates of the memory cells in the same columns. The plurality of bit lines are arranged in parallel in a direction of the columns, for connecting the doped regions of the memory cells in the same columns. The circuit is coupled to the non-volatile memory, comprising a column decoder coupled to the bit lines, a row decoder coupled to the word lines, and a data-in structure coupled to the column decoder, wherein a datum is stored in the non-volatile memory through the data-in structure.

According to the circuit system in an embodiment of the present invention, the material of the first, the second, the third, and the fourth charge trapping layer comprises nanocrystal, tantalum oxide, strontium titanate, or hafnium oxide.

According to the circuit system in an embodiment of the present invention, the material of the first, the second, the third, and the fourth charge trapping layer comprises silicon nitride.

According to the circuit system in an embodiment of the present invention, the material of the first, the second, the third, and the fourth charge trapping layer comprises silicon oxide/silicon nitride/silicon oxide (ONO) composite material.

According to the circuit system in an embodiment of the present invention, the semiconductor layer is formed through epitaxial lateral overgrowth.

According to the circuit system in an embodiment of the present invention, the memory cells in the same column are disposed adjacently in mirror symmetry.

According to the circuit system in an embodiment of the present invention, two adjacent memory cells disposed in mirror symmetry share the doped region.

According to the present invention, charge trapping layers are formed at both sides of gates through self-alignment, and a doped region in the semiconductor layer is used as a common source/drain region of two units, thus, a highly integrated memory cell is manufactured and multi-bit data can be stored in a single memory cell.

Moreover, since the charge trapping layers in such a memory cell are respectively disposed at two sides of the gates, the various bits can be easily programmed, erased, and read by supplying appropriate voltages to the source region, drain region, first gate, and second gate, and there won't be interference between the various bits, accordingly, the reliability of the memory cell and the electrical performance of a memory are both improved.

In order to make the aforementioned and other objects, features and advantages of the present invention comprehensible, preferred embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 3A-2 is a cross-sectional view illustrating a manufacturing flow of the non-volatile memory in FIG. 2 cut along line II-II'.

DESCRIPTION OF EMBODIMENTS

Figure 1A:
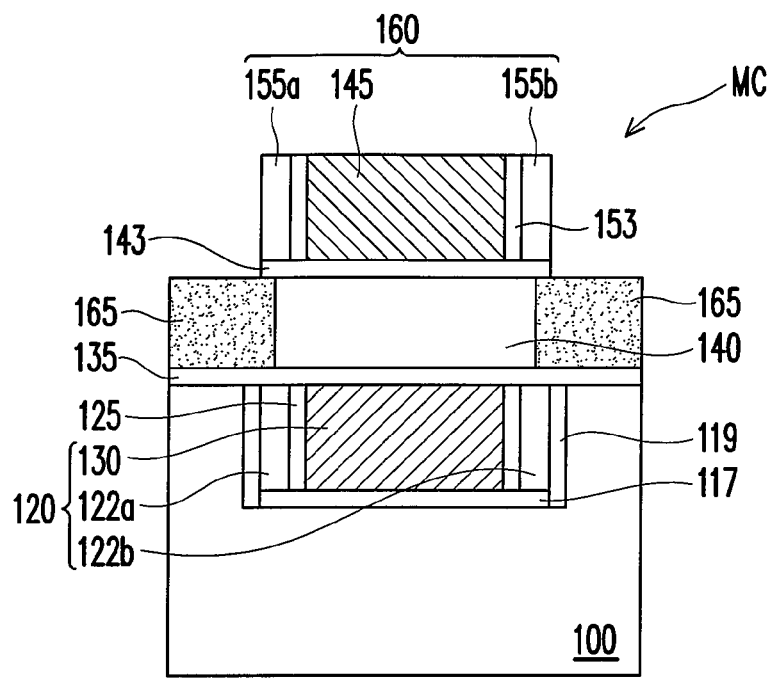
FIG. 1A is a cross-sectional view of a non-volatile memory according to an embodiment of the present invention.
Figure 1B:
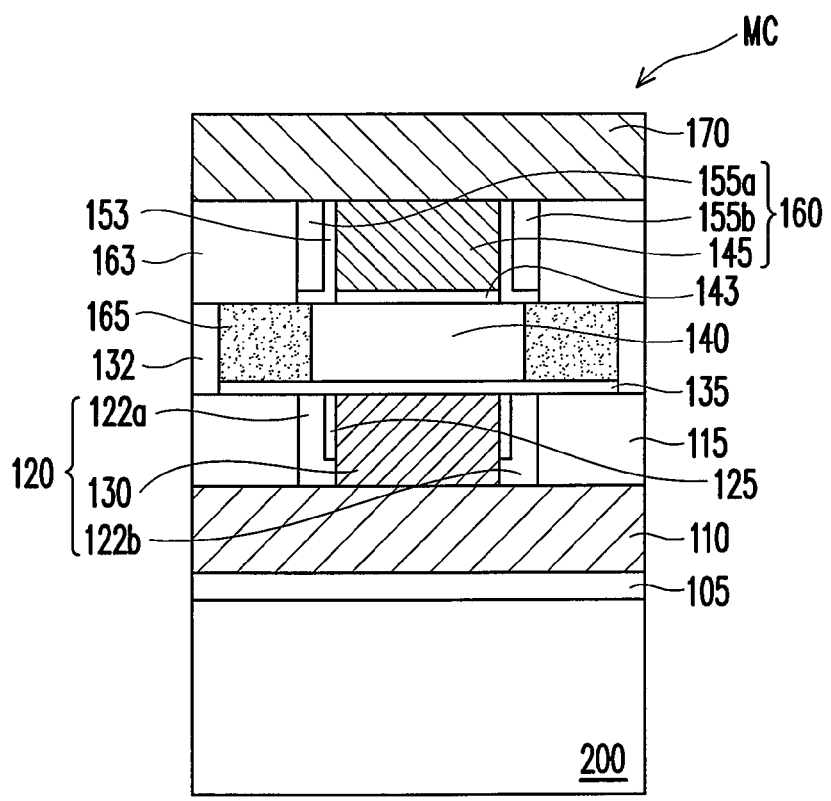
FIG. 1B is a cross-sectional view of a non-volatile memory according to another embodiment of the present invention.
Figure 2:
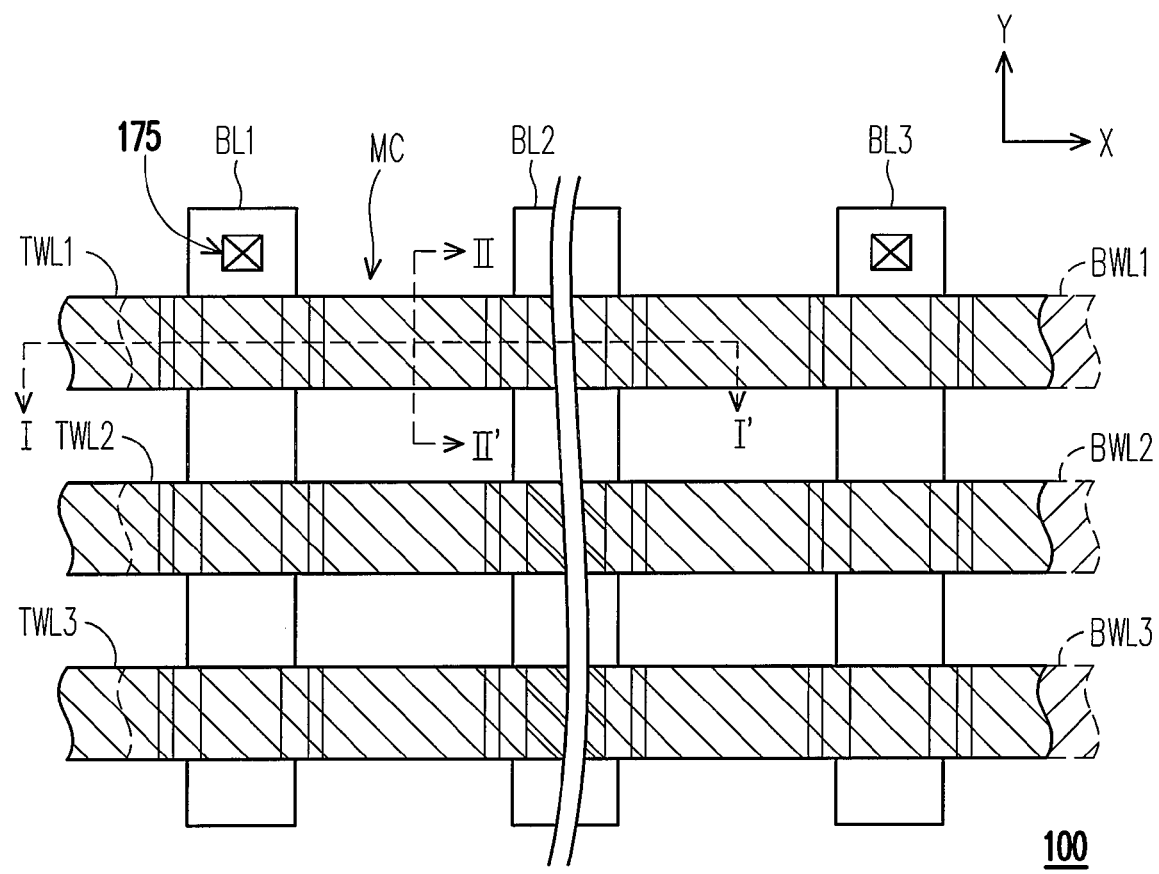
FIG. 2 is a top view of a non-volatile memory according to an embodiment of the present invention.

FIG. 1A is a cross-sectional view of a non-volatile memory according to an embodiment of the present invention. FIG. 1B is a cross-sectional view of a non-volatile memory according to another embodiment of the present invention. FIG. 2 is a top view of a non-volatile memory according to an embodiment of the present invention.

Referring to FIG. 1A and FIG. 1B, a single memory cell MC is used for describing the non-volatile memory in the present invention. The memory cell MC is disposed on a substrate 100 and is composed of a semiconductor layer 140, a first unit 120, a second unit 160, and a doped region 165.

Referring to FIG. 1A, the substrate 100 may be a silicon substrate. The first unit 120 includes a first gate 130, and a first charge trapping layer 122*a* and a second charge trapping layer 122*b* disposed at both sides of the first gate 130. The material of the first gate 130 may be doped polysilicon, and the material of the first charge trapping layer 122*a* and the second charge trapping layer 122*b* may be silicon nitride or composite material such as silicon oxide/silicon nitride, or silicon oxide/silicon nitride, silicon oxide/silicon nitride, silicon oxide (ONO, OSO). Certainly, the material of the first charge trapping layer 122*a* and the second charge trapping layer 122*b* is not limited to silicon nitride, which may also be any other material which can trap charges, such as nanocrystal, tantalum oxide, strontium titanate, or hafnium oxide.

A dielectric layer 125 is further disposed between the first gate 130 and the first charge trapping layer 122*a*, the second charge trapping layer 122*b*. The material of the dielectric layer 125 may be silicon oxide.

The first unit 120 may be disposed in the substrate 100, and a passivation layer 117 may be disposed between the first gate 130 of the first unit 120 and the substrate 100 to separate the first gate 130 and the substrate 100. In an embodiment of the present invention, a passivation layer 119 may also be disposed between the first charge trapping layer 122*a*, the second charge trapping layer 122*b* and the substrate 100 for preventing charges captured in the charge trapping layers from entering the substrate 100. The material of the passivation layer 117 and the passivation layer 119 may be silicon oxide.

Referring to FIG. 1B, in another embodiment of the present invention, the first unit 120 may also be disposed in the dielectric layer 115 on the substrate 100. The material of the dielectric layer 115 may be silicon oxide.

Referring to FIG. 1A and FIG. 1B the semiconductor layer 140 covering the first unit 120 is disposed on the substrate 100, and the lateral dimension thereof is greater than that of the first unit 120. The semiconductor layer 140 may be formed through epitaxial lateral overgrowth. A tunneling dielectric layer 135 is further disposed between the first unit 120 and the semiconductor layer 140, i.e. disposed between the semiconductor layer 140 and the first gate 130. The tunneling dielectric layer 135 may be a single layer or a multi-layer structure, such as silicon oxide or composite material like silicon oxide/silicon nitride, silicon oxide/silicon nitride, silicon oxide (ONO, OSO). The thickness of the bottom layer of silicon oxide in the composite material is less than 2 nm. In one embodiment, it may be between about 0.5~2 nm, and in another embodiment, it may be less then 1.5 nm. The thickness of the middle layer of silicon nitride, silicon oxide in the composite material is less than 2 nm, and in one embodiment, it may be about 1~2 nm. The thickness of the top layer of silicon oxide in the composite material is less than 2 nm, and, in one embodiment, it may be about 1.5~2 nm.

The second unit 160 is disposed on the semiconductor layer 140 and is in mirror symmetry to the first unit 120 with the semiconductor layer 140 as a symmetry axis. The second unit 160 includes a second gate 145 disposed on the semiconductor layer 140, and a third charge trapping layer 155a and a fourth charge trapping layer 155b disposed at both sides of the second gate 145.

The material of the second gate 145 may be a conductive material such as doped polysilicon or metal silicide. The material of the third charge trapping layer 155a and the fourth charge trapping layer 155b may be silicon nitride, composite material such as silicon oxide/silicon nitride, silicon oxide/silicon nitride/silicon oxide (ONO), or any other material which can trap charges, such as nanocrystal, SiON, tantalum oxide, strontium titanate, or hafnium oxide.

Referring to FIG. 1B, in another embodiment of the present invention, the semiconductor layer 140 may be disposed in the dielectric layer 132 for separating the semiconductor layer 140 of adjacent memory cell MC. A dielectric layer 163 may be disposed at both sides of the second units 160 to facilitate the formation of the word lines later. The material of the dielectric layer 132 and the dielectric layer 163 may be silicon oxide or similar dielectric material.

Referring to FIG. 1A, a tunneling dielectric layer 143 is disposed between the bottom of the third charge trapping layer 155a, the second gate 145, and the fourth charge trapping layer 155b of the second unit 160 and the semiconductor layer 140. The tunneling dielectric layer 143 may be a single layer or a multi-layer structure, such as silicon oxide or composite material like silicon oxide/silicon nitride, silicon oxide/silicon nitride, silicon oxide (ONO, OSO). The thickness of the bottom layer of silicon oxide in the composite material is less than 2 nm. In one embodiment, it may be between about 0.5~2 nm, and in another embodiment, it may be less then 1.5 nm. The thickness of the middle layer of silicon nitride, silicon oxide in the composite material is less than 2 nm, and in one embodiment, it may be about 1~2 nm. The thickness of the top layer of silicon oxide in the composite material is less than 2 nm, and in one embodiment, it may be about 1.5~2 nm. A dielectric layer 153 may be disposed between two sidewalls of the second gate 145 and the third charge trapping layer 155a and fourth charge trapping layer 155b, and the material of the dielectric layer 153 may be silicon oxide.

Referring to FIG. 1B, in another embodiment, the tunneling dielectric layer 143 may be disposed between the second gate 145 and the semiconductor layer 140. The dielectric layer 153 may be disposed between the sidewalls and the bottoms of the third charge trapping layer 155a and the forth charge trapping layer 155b and the second gate 145, the semiconductor layer 140. During the operation process of the memory, the charges can tunnel through the dielectric layer 153 (particularly the bottom parts of the charge trapping layers 155a and 155b) and the tunneling dielectric layer 143.

The doped region 165 is disposed in both sides of the semiconductor layer 140, that is, in the semiconductor layer 140 at both sides of the second unit 160 and the first unit 120 as a common source/drain region of the first unit 120 and the second unit 160. In an embodiment of the present invention, the substrate 100 may be a P-type substrate, and the doped region 165 may be an N-type doped region which is heavily doped with phosphor or arsenic.

The first charge trapping layer 122a, second charge trapping layer 122b, third charge trapping layer 155a, and fourth charge trapping layer 155b can respectively store data. In other words, multi-bit data can be stored in a single memory cell MC.

Referring to FIG. 2, a plurality of memory cells MC may be arranged as a column/row array on the substrate 100. Those memory cells MC in the same column (in direction X) are disposed adjacently in mirror symmetry. Any adjacent two memory cells MC may share the same doped region 165.

The memory cell array further includes bottom word lines BWL1, BWL2, BWL3, top word lines, TWL1, TWL2, TWL3, and bit lines BL1, BL2, BL3.

The bottom word lines BWL1, BWL2, and BWL3 connect the first gates 130 of the memory cells MC in the same column (in direction X); the top word lines TWL1, TWL2, and TWL3 connect the second gates 145 of the memory cells MC in the same column (in direction X); and the bit lines BL1, BL2, and BL3 may be connect the doped regions 165 of the memory cells MC in the same row (in direction Y) through a plug 175.

Referring to FIG. 1B, in an embodiment of the present invention, the bottom word lines 110 may be disposed between the substrate 100 and the first unit 120 and are electrically connected to the first gates 130. An insulation layer is further disposed between the bottom word lines 110 and the substrate 100 to separate the bottom word lines 110 and the substrate 100. The top word lines 170 are disposed on the second unit 160 and are electrically connected to the second gates 145. The material of the bottom word line 110 and the top word line 170 may be a conductive material such as doped polysilicon, aluminum, aluminum alloy, or metal silicide.

In a non-volatile memory in the present embodiment, a single memory cell has plural charge trapping layers, so that the memory cell can store multi-bit data. In other words, the memory cell in the present invention can store more data in per unit area and which is very advantageous in device integration.

In addition, the charge trapping layers are disposed at both sides of the gates, thus, charges in the charge trapping layers will not interfere with each other, accordingly, both the reliability and electrical performance of the memory are improved.

Figures 1, 3A:
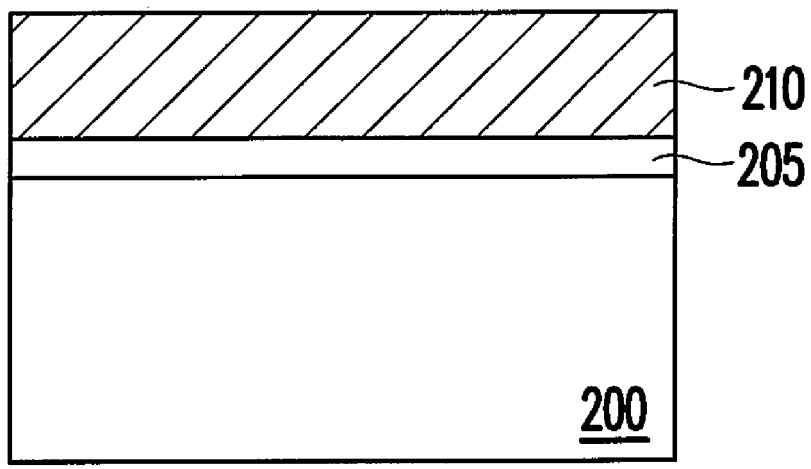
FIG. 3A-1 and FIGS. 3B~3G are cross-sectional views illustrating a manufacturing flow of the non-volatile memory in FIG. 2 cut along line I-I'.
Figures 2, 3A:
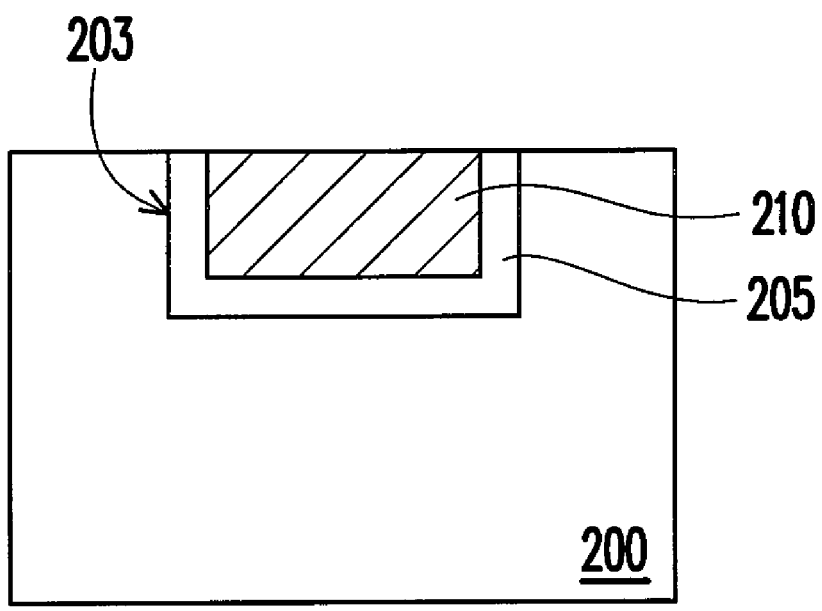

The present invention further provides a manufacturing method of a non-volatile memory. FIG. 3A-1 and FIGS. 3B~3G are cross-sectional views illustrating a manufacturing flow of the non-volatile memory in FIG. 2 cut along line I-I'. FIG. 3A-2 is a cross-sectional view illustrating a manufacturing flow of the non-volatile memory in FIG. 2 cut along line II-II'.

Referring to FIG. 3A-1 and FIG. 3A-2, according to the manufacturing method in the present embodiment, a substrate 200 is first provided, wherein the substrate 200 may be a silicon substrate and a recess 203 has been formed in the substrate 200. The formation method of the recess 203 may be as following: first, forming a patterned photoresist layer (not shown) on the substrate 200; removing portion of the substrate 200; and then removing the patterned photoresist layer.

Next, an insulation layer 205 and a bottom conductive layer 210 are formed sequentially to cover the substrate 200 and fill up the recess 203. After that, a planarization process is performed through chemical mechanical polishing to remove the bottom conductive layer 210 and the insulation layer 205 on the substrate 200.

Figure 3B:
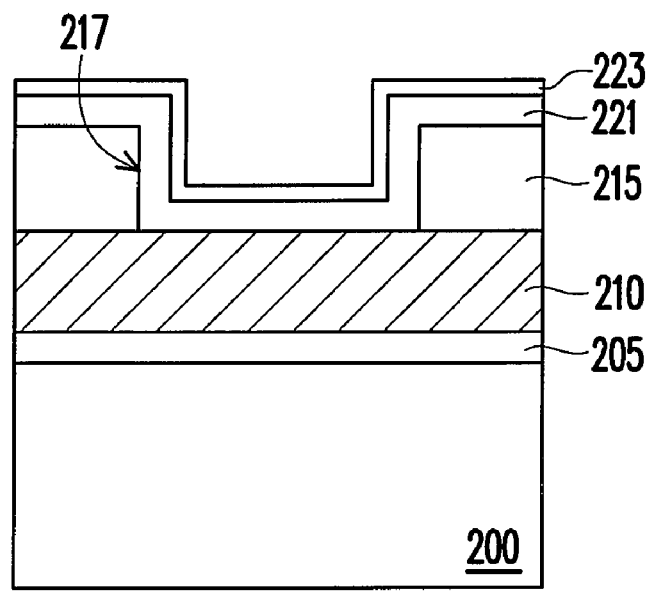

Next, referring to FIG. 3B, a dielectric layer 215 is formed on the bottom conductive layer 210. The material of the dielectric layer 215 may be silicon oxide, and the formation method thereof may be chemical vapor deposition (CVD). After that, an opening 217 is formed in the dielectric layer 215 to expose the bottom conductive layer 210. The opening 217 may be formed through photolithography and etching processes.

Thereafter, a charge trapping material layer 221 and a dielectric material layer 223 are sequentially formed on the substrate 200. The material of the charge trapping material layer 221 may be any material which can trap charges, such as silicon nitride, nanocrystal, SiON, composite material such as silicon oxide/silicon nitride or silicon oxide/silicon nitride/ silicon oxide (ONO), tantalum oxide, strontium titanate, or hafnium oxide, and the formation method of the charge trapping material layer 221 may be CVD. The material of the dielectric material layer 223 may be silicon oxide, and the formation method thereof may be CVD.

Figure 3C:
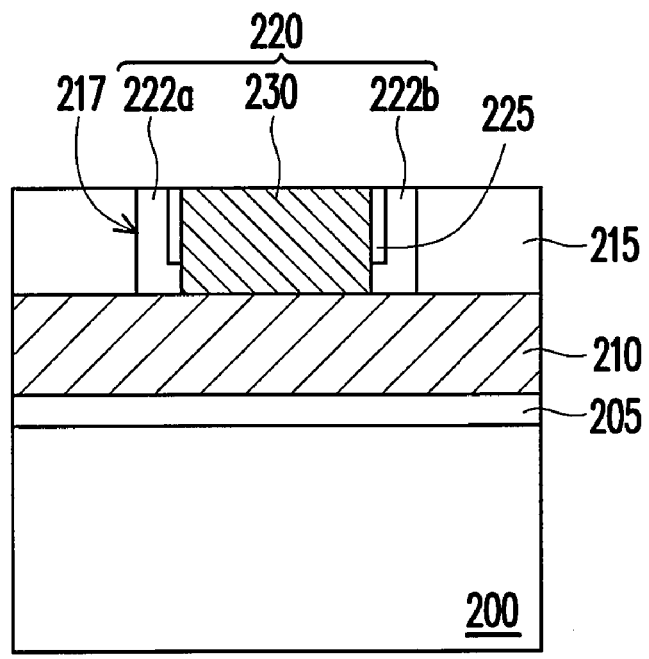

Next, referring to FIG. 3C, portion of the dielectric material layer 223 and portion of the charge trapping material layer 221 are removed, so as to form the charge trapping layers 222a, 222b, and the dielectric layer 225 on two sidewalls of the opening 217 and expose the bottom conductive layer 210. The method for removing portion of the dielectric material layer 223 and portion of the charge trapping material layer 221 may be dry etching or wet etching. After that, the gate 230 connected to the bottom conductive layer 210 is filled into the opening 217. The method for forming the gate 230 may be forming an integral conductive layer (not shown) on the substrate 200, and the material of the conductive layer may be doped polysilicon. The conductive layer on the dielectric layer 215 is then removed through a planarization process such as chemical mechanical polishing. The gate 230 and the charge trapping layers 222a, 222b form the first unit 220 of the memory cell.

Figure 3D:
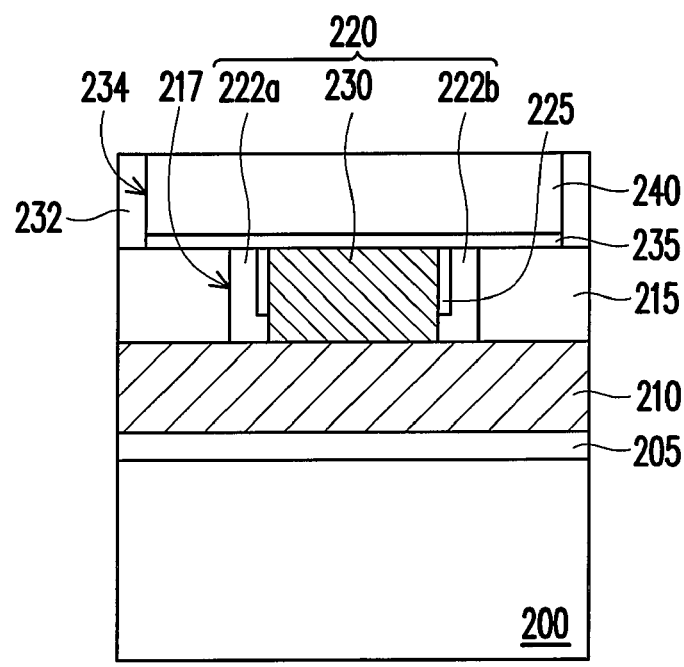

Thereafter, referring to FIG. 3D, another dielectric layer 232 is formed on the substrate 200. The material of the dielectric layer 232 may be silicon oxide, and the formation method thereof may be CVD. After that, another opening 234 is formed in the dielectric layer 232 to expose the first unit 220. The formation method of the opening 234 may be a photolithography etching process. The lateral dimension of the opening 234 may be greater than that of the first unit 220 to expose the dielectric layer 215.

Thereafter, a tunneling dielectric layer 235 is formed in the opening 234. The tunneling dielectric layer 235 may be a single layer or a multi-layer structure, such as silicon oxide, or composite material like silicon oxide/silicon nitride, silicon oxide/silicon nitride, silicon oxide (ONO, OSO), and the formation method thereof may be CVD. The tunneling dielectric layer 235 formed through CVD has excellent film quality. However, the tunneling dielectric layer 235 may also be formed by leaving portion of the dielectric layer 232 while forming the opening 234.

Next, the semiconductor layer 240 is filled in the opening 234. The material of the semiconductor layer 240 may be silicon, and the formation method thereof may be epitaxial lateral overgrowth.

Figure 3E:
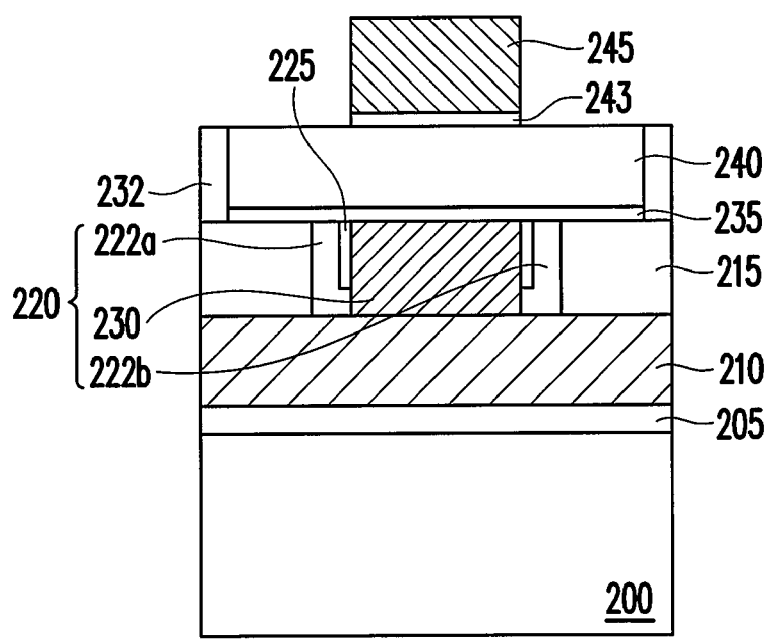

Next, referring to FIG. 3E, a dielectric layer 243 and a gate 245 are formed on the substrate 200. The formation method of the dielectric layer 243 and the gate 245 may be sequentially forming a dielectric material layer (not shown) and a gate material layer (not shown) on the substrate 200 and then patterning the foregoing material layers through a photolithography etching process. The dielectric material layer may be a single layer or a multi-layer structure, such as silicon oxide, or composite material like silicon oxide/silicon nitride, silicon oxide/silicon nitride, silicon oxide (ONO, OSO), and the formation method thereof may be CVD. The material of the gate material layer may be doped polysilicon, and the formation method thereof may be performing an ion implantation process to an undoped polysilicon layer formed through CVD, or may also be CVD through in-situ dopant implantation.

Figure 3F:
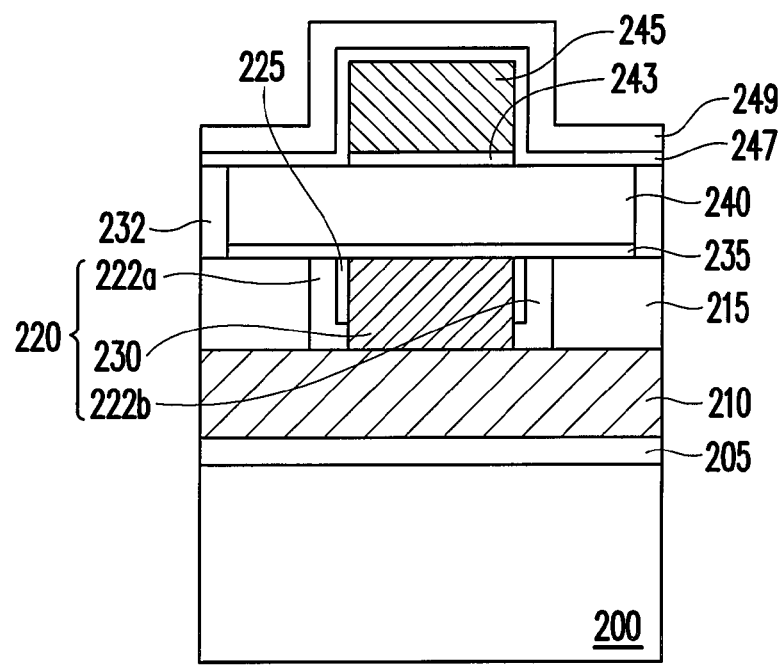

After that, referring to FIG. 3F, an integral dielectric material layer 247 and an integral charge trapping material layer 249 are sequentially formed on the substrate 200. The dielectric material layer 247 may be a single layer or a multi-layer structure, such as silicon oxide, or composite material like silicon oxide/silicon nitride, silicon oxide/silicon nitride, silicon oxide (ONO, OSO), and the formation method thereof may be CVD. The material of the charge trapping material layer 249 may be nanocrystal, silicon nitride, SiON, tantalum oxide, $SrTiO_3$, or $HfO_2$, and the formation method thereof may be CVD.

Figure 3G:
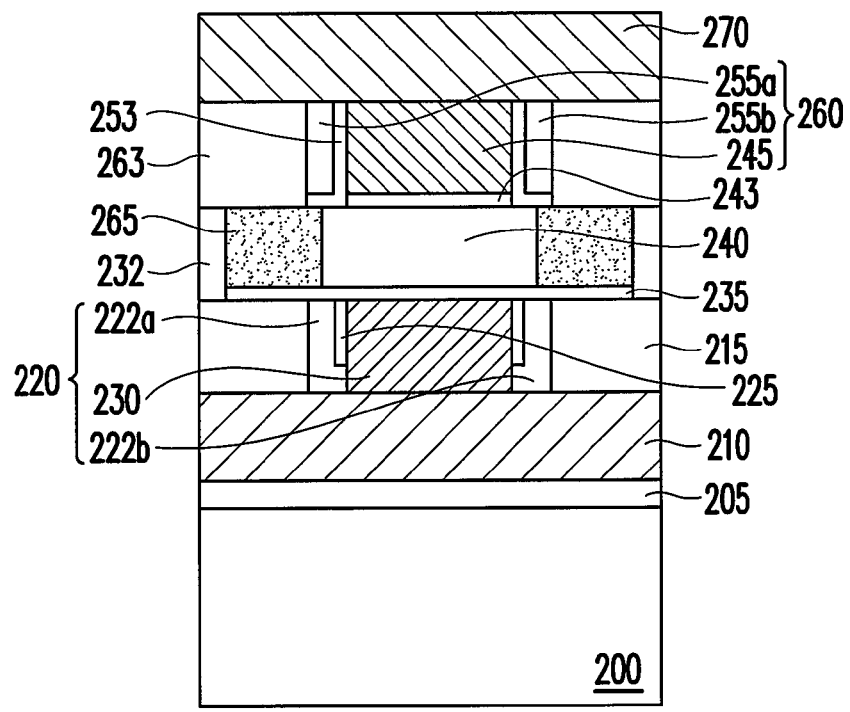

Thereafter, referring to FIG. 3G, portion of the charge trapping material layer 249 and portion of the dielectric material layer 247 are removed and only the portions on the sidewalls of the gate 245 are remained, so as to form the charge trapping layers 255a, 255b and the dielectric layer 253. The gate 245 and the charge trapping layers 255a, 255b form the second unit 260 of the memory cell. The dielectric layer 253 (particularly the bottom parts of the charge trapping layers 255a and 255b) and the dielectric layer 243 may be used as the tunneling dielectric layers of the second unit 260, and during operation of memory cell, charges tunnel into and out of the charge trapping layers 255a and 255b through these dielectric layers.

Next, a doped region 265 is formed in both sides of the semiconductor layer 240. The doped region 265 may be formed by performing a dopant implantation process with N-type dopant such as phosphor ion or arsenic ion. The doped region 265 is disposed in the semiconductor layer at both sides of the second unit 260 and the first units 220 and can be used as the common source/drain region of the second unit 260 and the first unit 220.

A dielectric layer 263 and a top conductive layer 270 are then formed on the substrate 200. The top conductive layer 270 is connected to the gate 245 and used as a top word line of the memory. The bottom conductive layer 210 at the bottom of the memory connected to the gate 230 is used as a bottom word line of the memory. The subsequent processes for forming the plug, the bit lines, and for completing the memory are familiar to those skilled in the art, therefore which will not be described herein.

According to the manufacturing method of a non-volatile memory in the present embodiment, through self-alignment and disposition of spacers, the charge trapping layers 222a and 222b are formed at both sides of the gate 230, and the charge trapping layers 255a and 255b are formed at both sides of the gate 230. The multi-bit structure of a single memory cell reduces the space taken by a memory in the layout of a chip; accordingly, device integration is greatly improved.

Figure 4A:
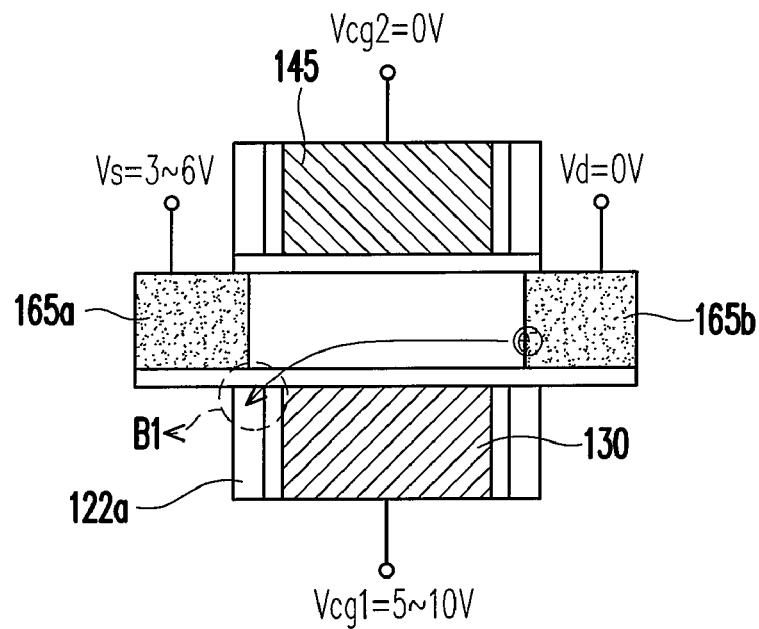
FIGS. 4A~4C illustrate the operation of a first bit in a single memory cell of a non-volatile memory according to an embodiment of the present invention.
Figure 4B:
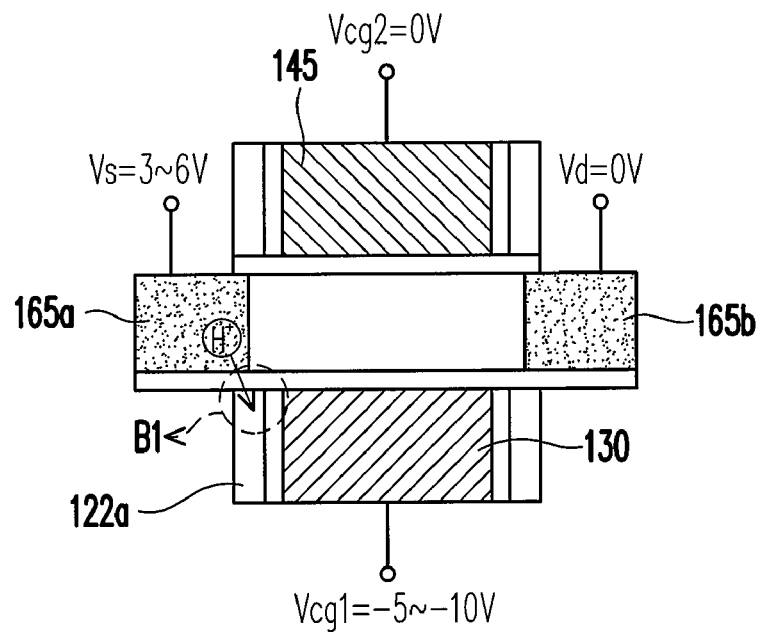
Figure 4C:
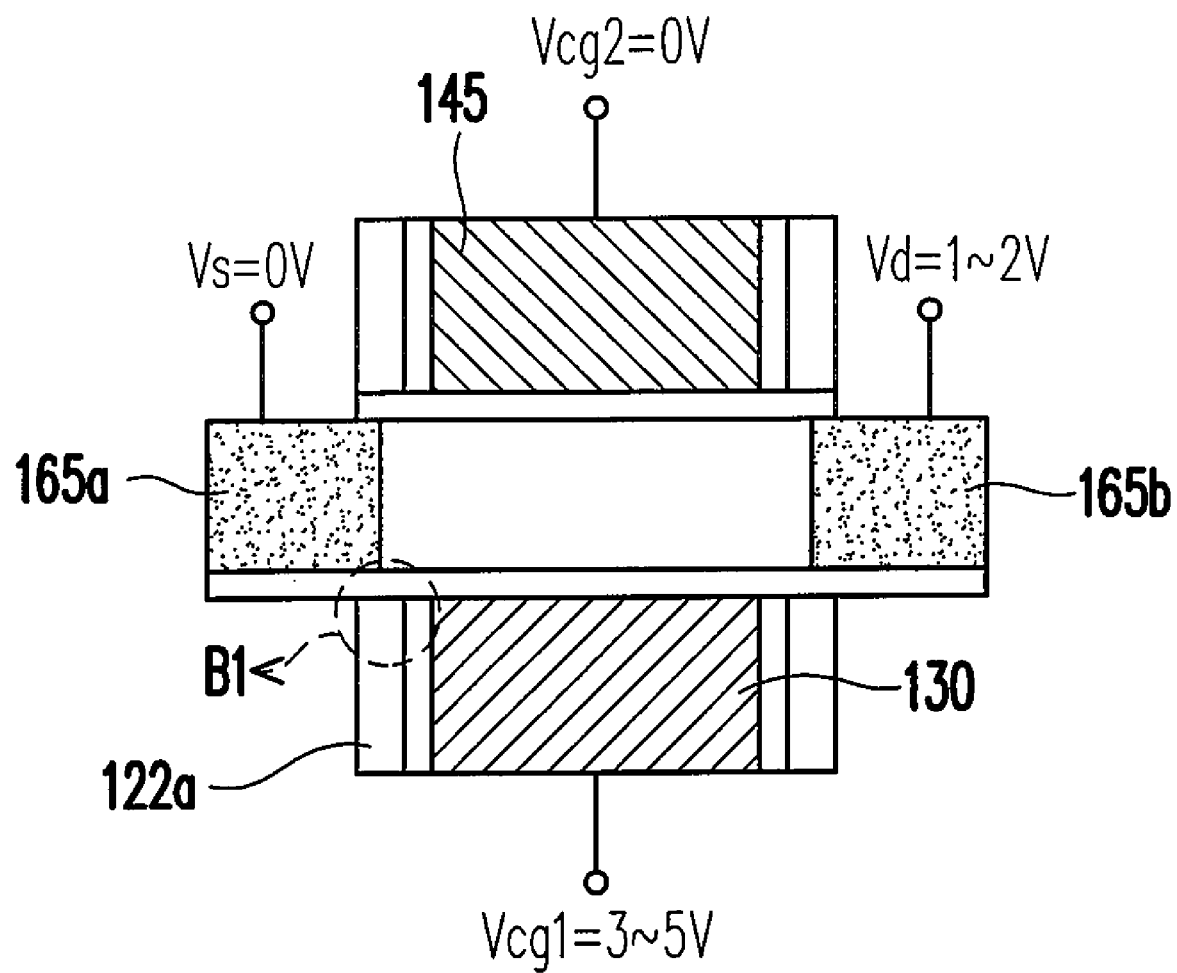
Figure 5A:
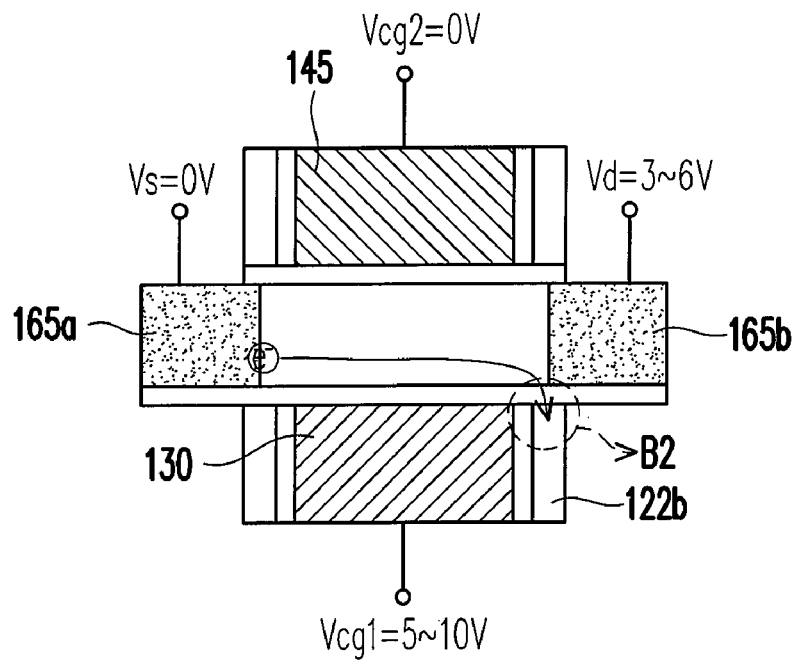
FIGS. 5A~5C illustrate the operation of a second bit in a single memory cell of a non-volatile memory according to an embodiment of the present invention.
Figure 5B:
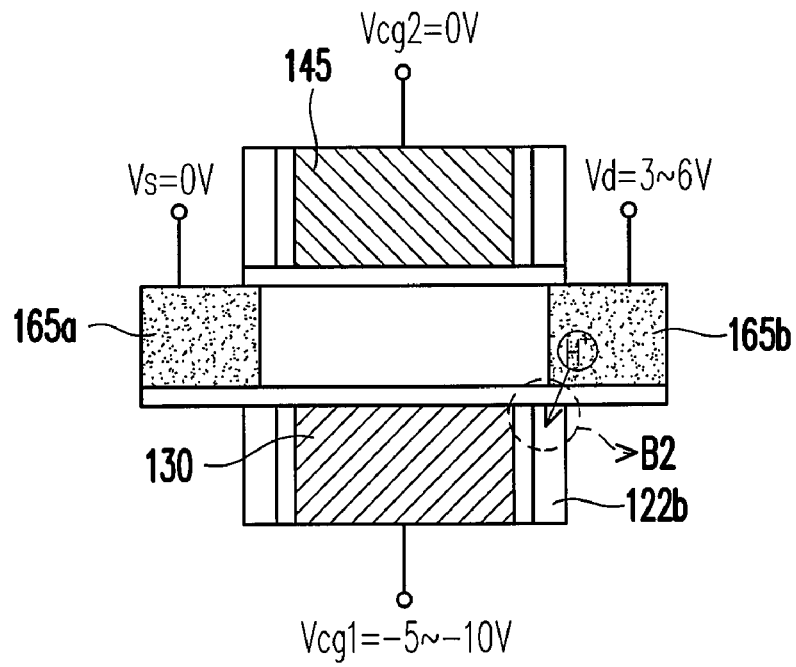
Figure 5C:
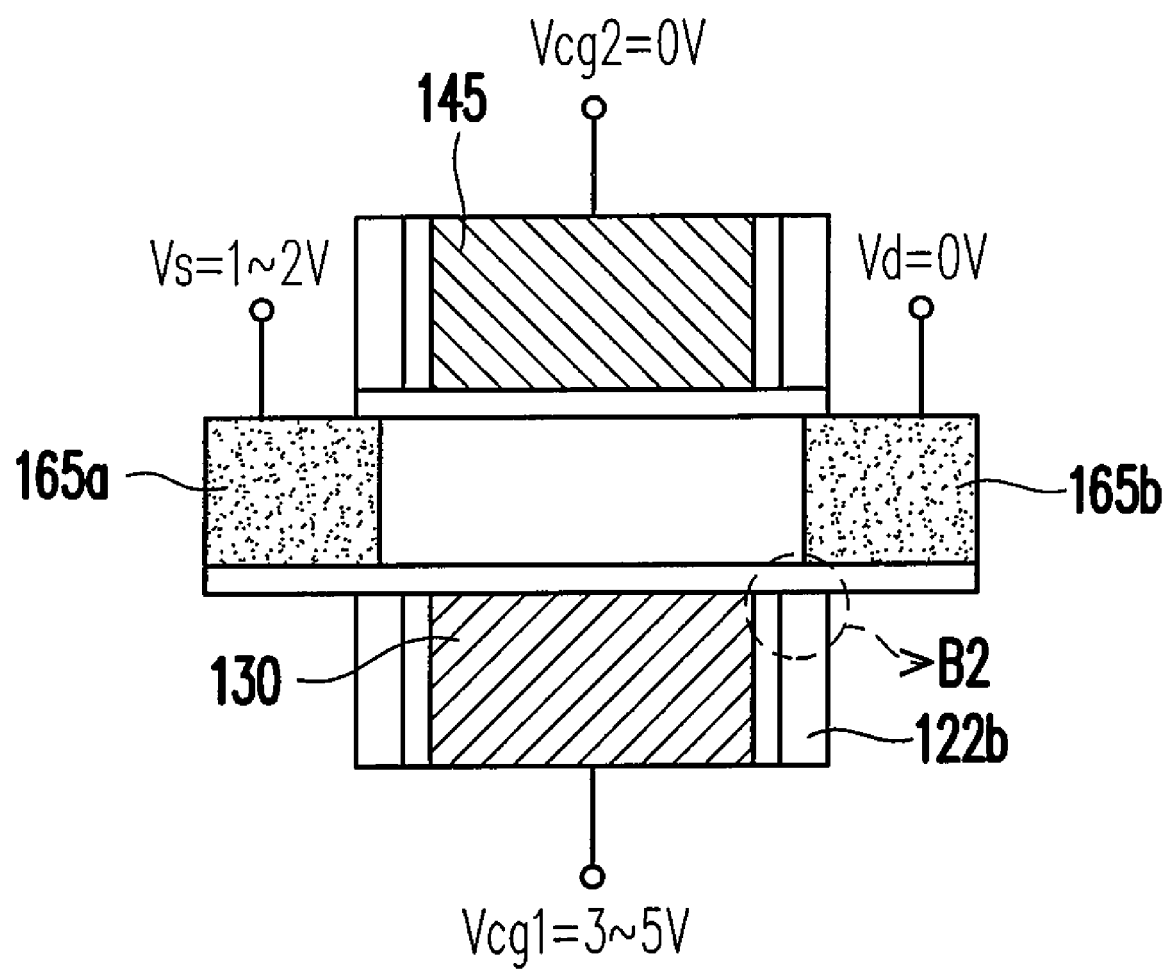
Figure 6A:
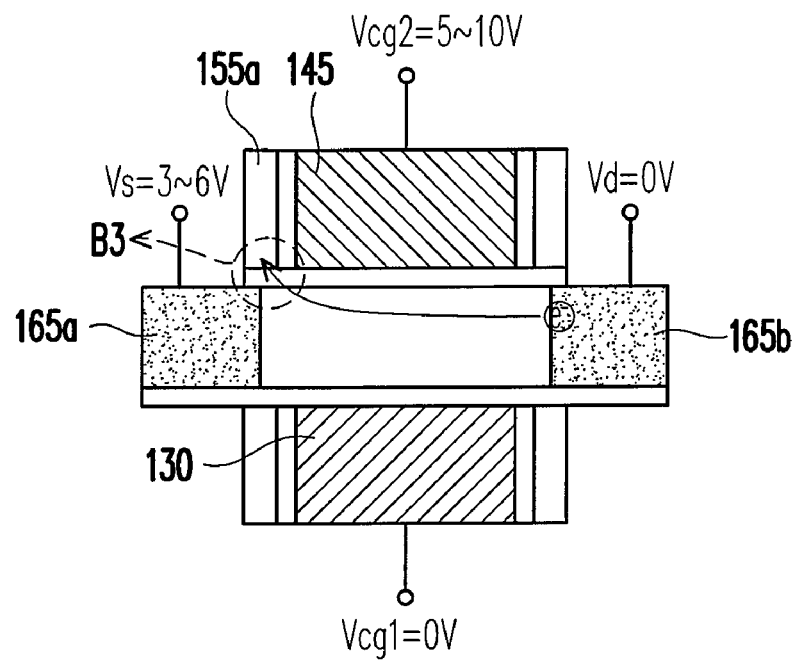
FIGS. 6A~6C illustrate the operation of a third bit in a single memory cell of a non-volatile memory according to an embodiment of the present invention.
Figure 6B:
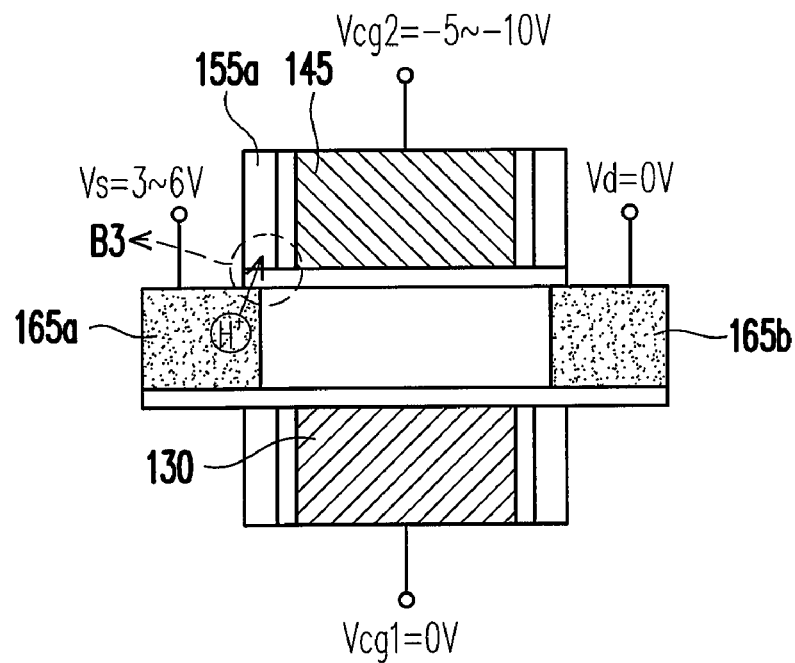
Figure 6C:
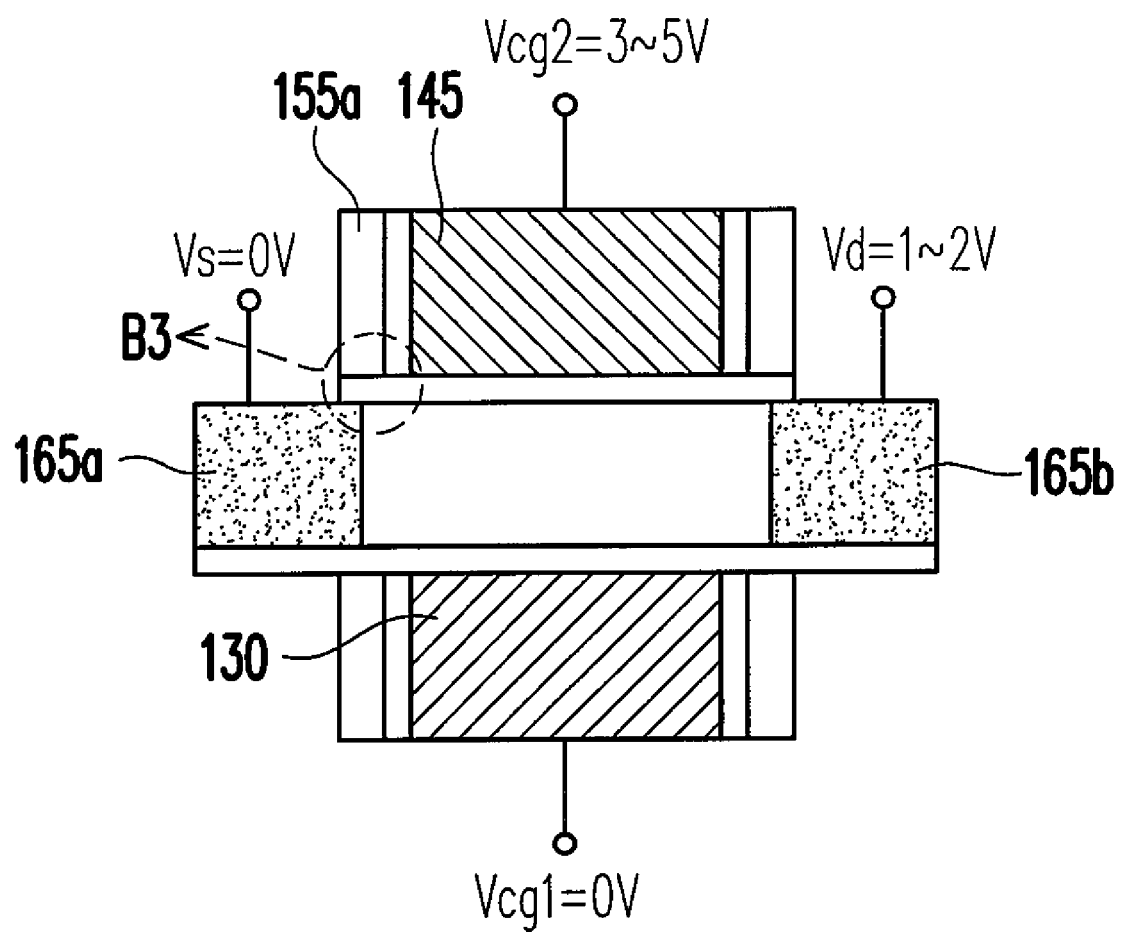
Figure 7A:
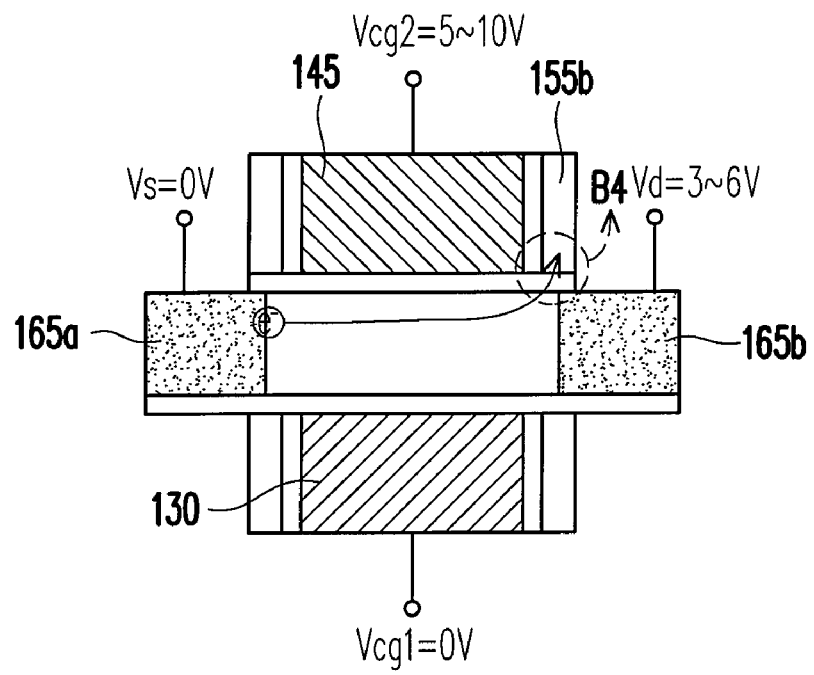
FIGS. 7A~7C illustrate the operation of a fourth bit in a single memory cell of a non-volatile memory according to an embodiment of the present invention.
Figure 7B:
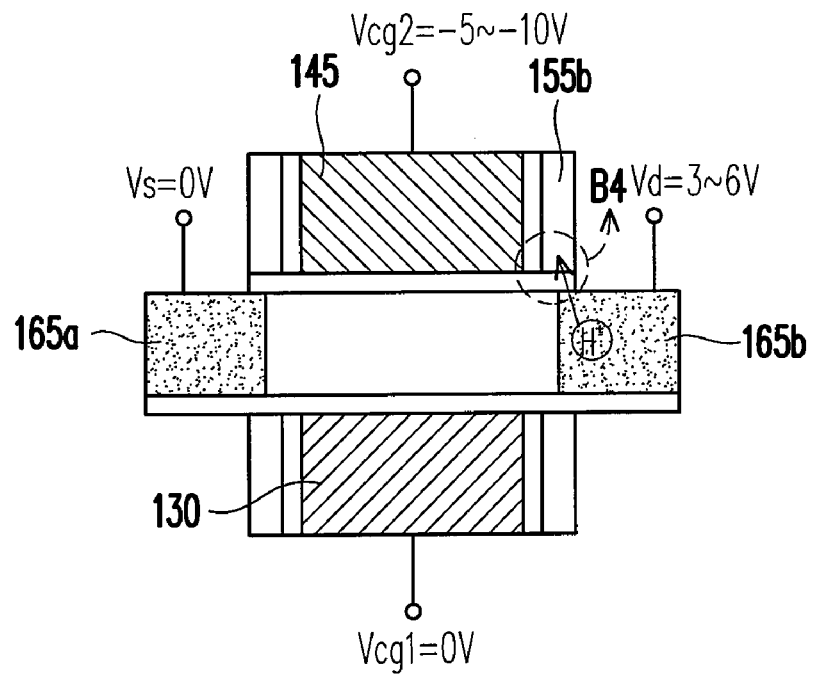
Figure 7C:
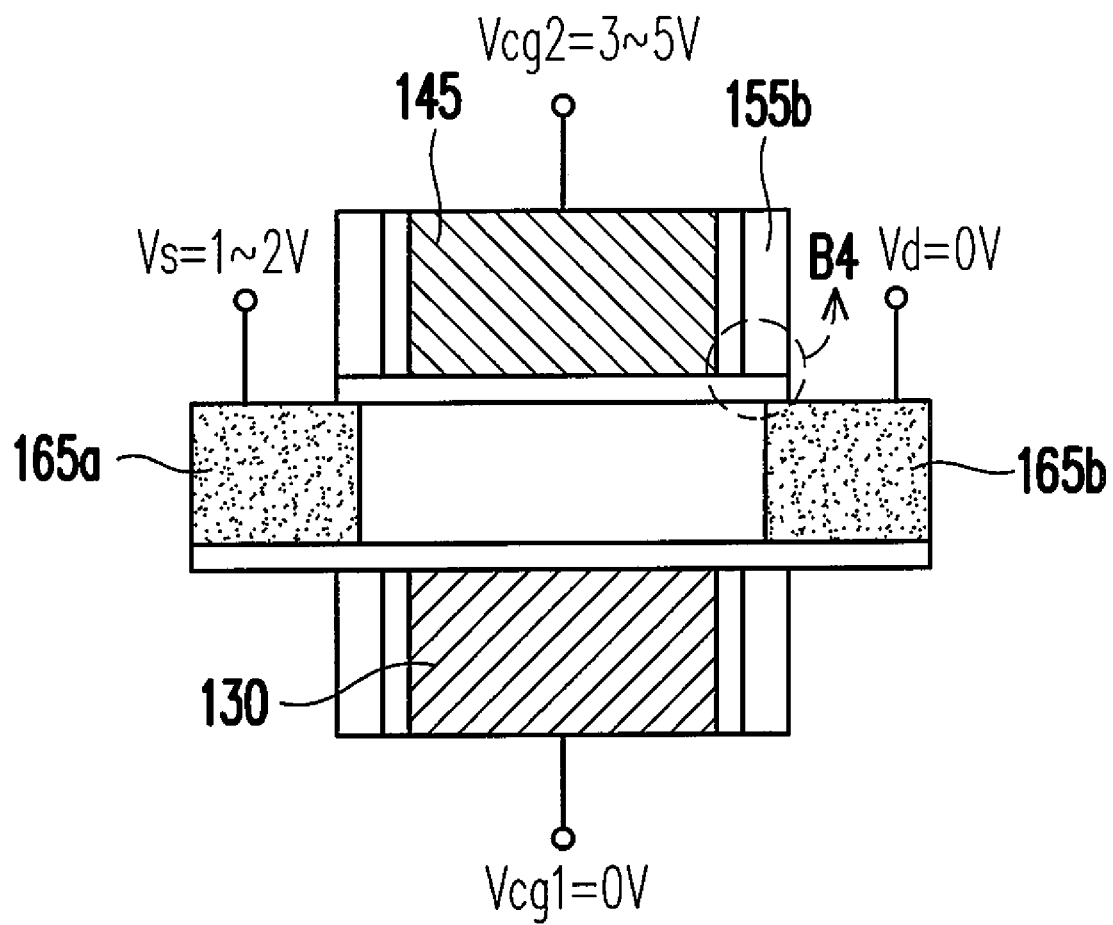
Figure 8:
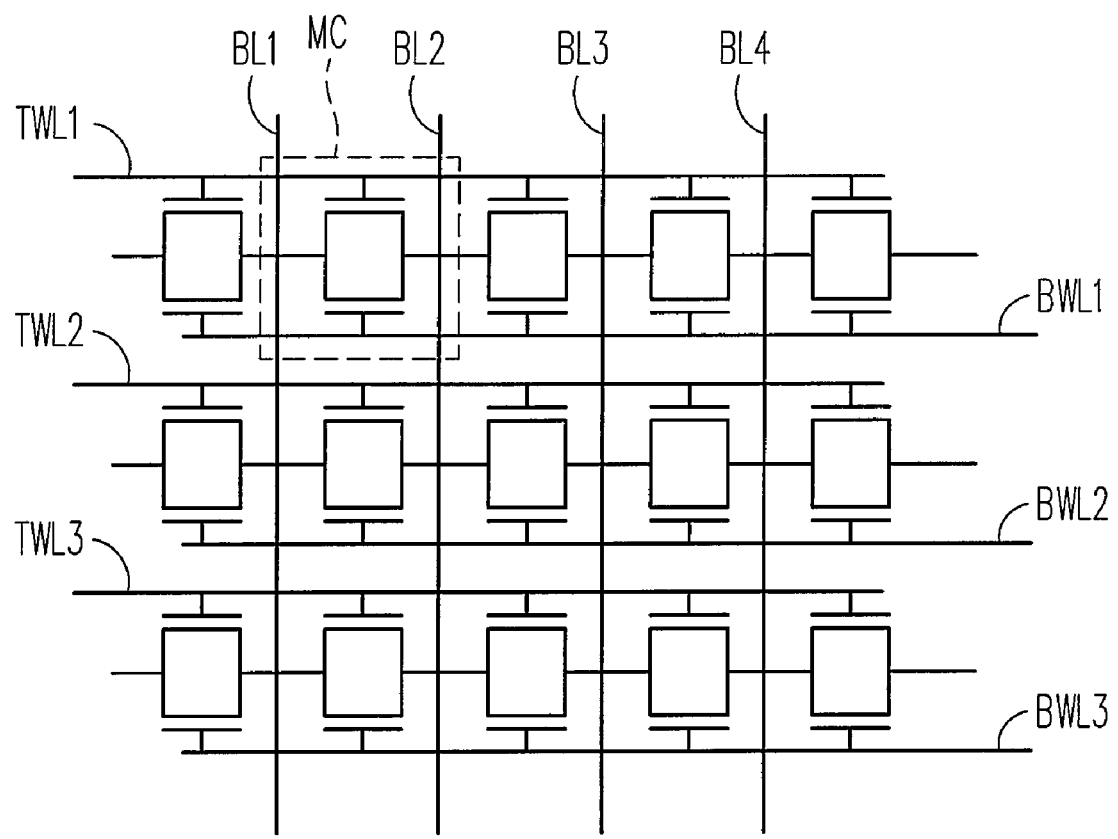
FIG. 8 is a simplified circuit diagram of a non-volatile memory according to an embodiment of the present invention.

An operating method of a non-volatile memory in the present invention will be described below. FIGS. 4A~4C illustrate the operation of a first bit in a single memory cell of a non-volatile memory according to an embodiment of the present invention. FIGS. 5A~5C illustrate the operation of a second bit in a single memory cell of a non-volatile memory according to an embodiment of the present invention. FIGS. 6A~6C illustrate the operation of a third bit in a single memory cell of a non-volatile memory according to an embodiment of the present invention. FIGS. 7A~7C illustrate the operation of a fourth bit in a single memory cell of a non-volatile memory according to an embodiment of the present invention. FIG. 8 is a simplified circuit diagram of a non-volatile memory according to an embodiment of the present invention.

In the present embodiment, the structure of the memory cell is the same as that in FIG. 2, and to describe the operating method of the memory cell in the present embodiment more clearly, the memory cells illustrated in FIGS. 4A~4C, FIGS. 5A~5C, FIGS. 6A~6C, and FIGS. 7A~7C are composed of the first unit, second unit, semiconductor layer, and doped region in FIG. 2. The reference numerals used here are the same as those used in FIG. 2, and the structure of the memory cell will not be described herein. It should be noted that the doped region 165 in FIG. 2 is denoted respectively as a source region 165a and a drain region 165b in the present embodiment.

Referring to FIG. 4A, while performing a program operation to the memory cell, a voltage Vcg1 is supplied to the gate 130, a voltage Vs is supplied to the source region 165a, a voltage Vd is supplied to the drain region 165b, and a voltage Vcg2 is supplied to the gate 145, wherein the voltage Vcg1 is higher than the voltage Vs, and the voltage Vs is higher than the voltage Vd and voltage Vcg2. Electrons are injected into the charge trapping layer 122a through channel hot electron injection, so as to store a first bit B1 into the memory cell. In an embodiment of the present invention, the voltage Vcg1 may be between 5V and 10V, preferably 8V; the voltage Vs may be between 3V and 6V, preferably 4V; and the voltage Vd and the voltage Vcg2 may be both 0V.

Referring to FIG. 4B, while performing an erase operation to the memory cell, the voltage Vcg1 is supplied to the gate 130, the voltage Vs is supplied to the source region 165a, the voltage Vd is supplied to the drain region 165b, and the voltage Vcg2 is supplied to the gate 145, wherein the voltage Vcg1 is lower than the voltage Vs, Vd and Vcg2, and the voltage Vs is higher than the voltage Vd and voltage Vcg2. Holes are injected into the charge trapping layer 122a through band-to-band hot hole (BTBHH) injection, so as to erase the first bit B1 previously stored in the memory cell. In an embodiment of the present invention, the voltage Vcg1 may be between −5V and −10V, preferably −8V; the voltage Vs may be between +3V and +6V, preferably +4V; and the voltage Vd and the voltage Vcg2 may be both 0V.

Referring to FIG. 4C, while performing a read operation to the memory cell, the voltage Vcg1 is supplied to the gate 130, a voltage Vs is supplied to the source region 165a, the voltage Vd is supplied to the drain region 165b, and the voltage Vcg2 is supplied to the gate 145, wherein the voltage Vcg1 is higher than the voltage Vd, and the voltage Vd is higher than the voltage Vs and voltage Vcg2. The storage state of the first bit B1 in the charge trapping layer 122a is read through reverse reading. In an embodiment of the present invention, the voltage Vcg1 may be between 3V and 5V, preferably 3V; the voltage Vd may be between 1V and 2V, preferably 1.6V; and the voltage Vs and the voltage Vcg2 may be both 0V.

According to the non-volatile memory in the present invention, a single memory cell has four charge trapping layers for respectively storing data, and FIGS. 4A~4C respectively illustrate the methods of program, erase, and read to the first bit B1 in the charge trapping layer 122a. The second bit B2 in the charge trapping layer 122b, the third bit B3 in the charge trapping layer 155a, and the fourth bit B4 in the charge trapping layer 155b have similar operation mechanisms at those of the first bit B1 and which will be further described below.

Referring to FIGS. 5A~5C, the only difference of the methods for programming, erasing, and reading the second bit B2 in the charge trapping layer 122b from the methods for programming, erasing, and reading the first bit B1 in the charge trapping layer 122a is that the voltages supplied to the source region 165a and the drain region 165b are exchanged so that electrons or holes are injected into the charge trapping layer 122b instead to program, erase, and read the second bit B2.

Referring to FIGS. 6A~6C, the difference between the operating methods of the third bit B3 in the charge trapping layer 155a and the operating methods of the first bit B1 is that the voltages supplied to the gate 145 and the gate 130 are exchanged so that electrons or holes are injected into the charge trapping layer 115a to program, erase, and read the third bit B3.

Referring to FIGS. 7A~7C, the difference between the operating methods of the fourth bit B4 in the charge trapping layer 155b and the operating methods of the first bit B1 is that the voltages supplied to the gate 145 and the gate 130 are exchanged, and the voltage Vs supplied to the source region 165a and the voltage Vd supplied to the drain region 165b are exchanged, so that electrons or holes are injected into the charge trapping layer 115a to program, erase, and read the fourth bit B4.

In foregoing embodiments, the operating methods of a single memory cell are described; however, such memory cells may also be arranged as a column/row array to form a memory. FIG. 1 is a top view of such a memory, and FIG. 8 is a simplified circuit diagram of this memory.

Referring to FIG. 8, taking the first bit B1 of the memory cell MC as an example, while performing a program operation, the voltage Vcg1 is supplied to the bottom word line BWL1, the voltage Vs is supplied to the bit line BL1, the voltage Vd is supplied to the bit line BL2, and the voltage Vcg2 is supplied to the top word line TWL1, wherein the voltage Vcg1 is higher than the voltage Vs, and the voltage Vs is higher than the voltage Vd and the voltage Vcg2, and a first bit B1 is stored into the memory cell MC through channel hot electron injection. In an embodiment of the present invention, the voltage Vcg1 may be between 5V and 10V, preferably 8V; the voltage Vs may be between 3V and 6V, preferably 4V; and the voltage Vd and the voltage Vcg2 may be both 0V.

While performing an erase operation, the voltage Vcg1 is supplied to the bottom word line BWL1, the voltage Vs is supplied to the bit line BL1, the voltage Vd is supplied to the bit line BL2, and the voltage Vcg2 is supplied to the top word line TWL1, wherein the voltage Vcg1 is lower than the voltage Vs, Vd, and Vcg2, and the voltage Vs is higher than the voltage Vd and the voltage Vcg2. The first bit B1 previously stored in the memory cell MC is erased through BTBHH. In an embodiment of the present invention, the voltage Vcg1 may be between −5V and −10V, preferably −8V; the voltage Vs may be between +3V and +6V, preferably +4V; and the voltage Vd and the voltage Vcg2 may be both 0V.

While performing a read operation, the voltage Vcg1 is supplied to the bottom word line BWL1, the voltage Vs is supplied to the bit line BL1, the voltage Vd is supplied to the bit line BL2, and the voltage Vcg2 is supplied to the top word line TWL1, wherein the voltage Vcg1 is higher than the voltage Vd, and the voltage Vd is higher than the voltage Vs and the voltage Vcg2. The storage state of the first bit B1 of the memory cell MC is read through reverse reading. In an embodiment of the present invention, the voltage Vcg1 may be between 3V and 5V, preferably 3V; the voltage Vd may be between 1V and 2V, preferably 1.6V; and the voltage Vs and the voltage Vcg2 may be both 0V.

The operating methods to the second, third, and fourth bits of the memory cell MC can be derived from foregoing description of the operating methods to the second, third, and fourth bits of a single memory cell by those skilled in the art, therefore which will not be described herein.

According to the operating method of a non-volatile memory in the present invention, appropriate biases are respectively supplied to the gate 130, the gate 145, the source region 165a, and the drain region 165b, so that the memory can be operated by simply controlling the actions of charges. Moreover, since charge trapping layers are disposed at both sides of the gates, the operations to various bits will not interfere with each other, accordingly, the reliability and electrical performance of the memory can be both improved.

Figure 9:
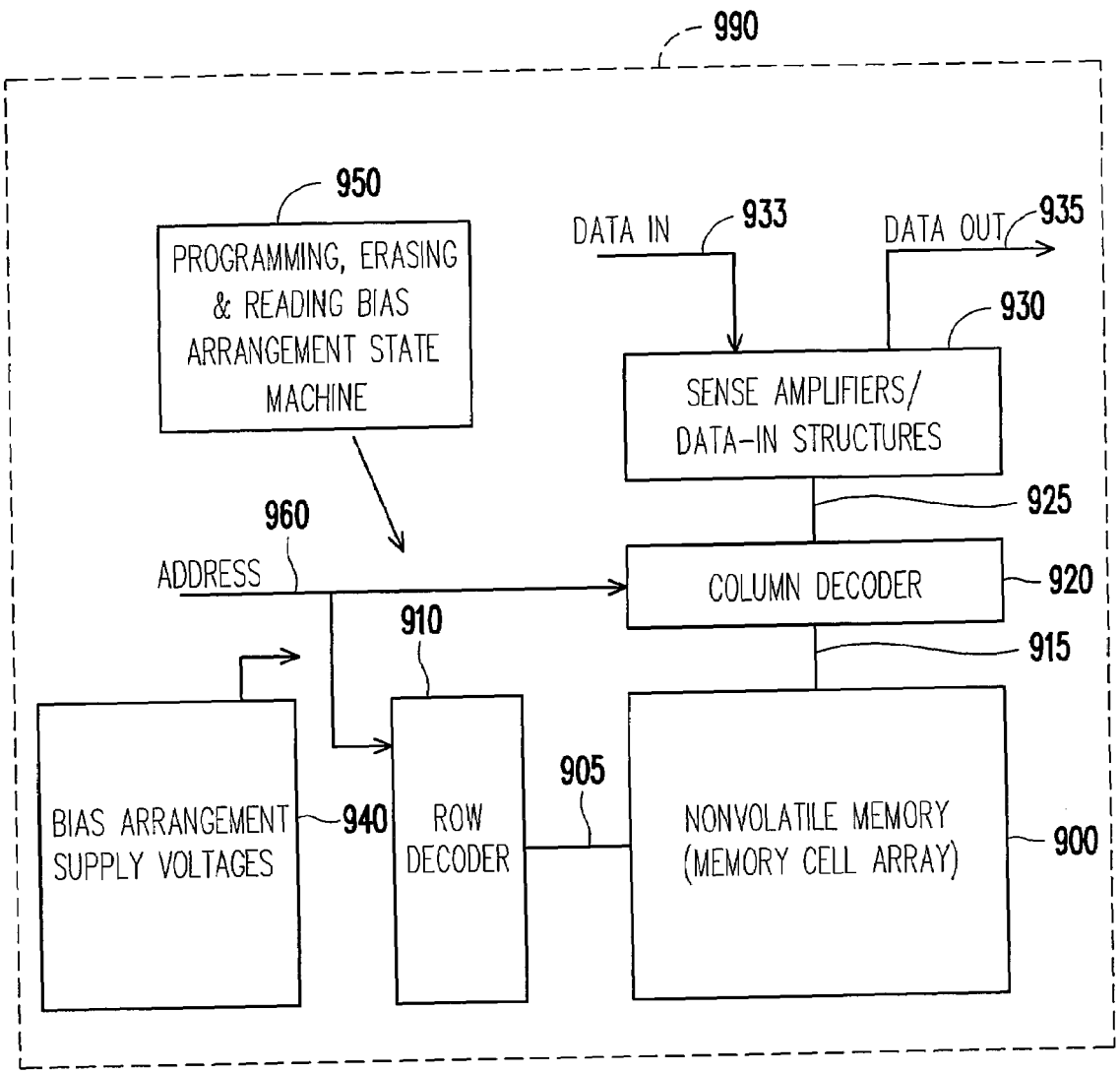
FIG. 9 is a simplified circuit block diagram of an integrated circuit applying to an embodiment of the present invention.

FIG. 9 is a simplified circuit block diagram of an integrated circuit applying an embodiment of the present invention. The circuit 990 includes a nonvolatile memory (memory cell array) 900 implemented using memory cells which have multi-bits per cell, on a semiconductor substrate. A row decoder 910 is coupled to a plurality of word lines 905, and arranged along rows in the memory cell array 900. A column decoder 920 is coupled to a plurality of bit lines 915 arranged along columns in the memory cell array 900 for reading and programming data from the multi-bit memory cells in the array 900. Addresses are supplied on bus 960 to column decoder 920 and row decoder 910. Sense amplifiers and data-in structures in block 930 are coupled to the column decoder 920 via data bus 925. Data is supplied via the data-in line 933 from input/output ports on the circuit 990 or from other data sources internal or external to the circuit 990, to the data-in structures in block 930. In the illustrated embodiment, other circuitry is included in the circuit 990, such as a general purpose processor or special purpose application circuitry, or a combination of modules supported by the multi-bit memory cell array. Data is supplied via the data-out line 935 from the sense amplifiers in block 930 to input/output ports on the circuit 990, or to other data destinations internal or external to the circuit 990.

A controller implemented in this example using programming, erasing & reading bias arrangement state machine 950 controls the application of bias arrangement supply voltages 940, such as read, program, erase, erase verify and program verify voltages. The controller can be implemented using special-purpose logic circuitry as known in the art. In alternative embodiments, the controller comprises a general-purpose processor, which executes a computer program to control the operations of the device. In yet other embodiments, a combination of special-purpose logic circuitry and a general-purpose processor may be utilized for implementation of the controller.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A non-volatile memory, comprising:
   a memory cell, disposed on a substrate, the memory cell comprising:
      a first unit, comprising:
         a first gate; and
         a first charge trapping layer and a second charge trapping layer, respectively disposed at both sides of the first gate;
      a semiconductor layer, disposed on the substrate and covering the first unit, the lateral dimension of the semiconductor layer being greater than the lateral dimension of the first unit;
      a second unit, disposed on the semiconductor layer, the second unit being in mirror symmetry to the first unit with the semiconductor layer as a symmetry axis, the second unit comprising:
         a second gate, disposed on the semiconductor layer; and
         a third charge trapping layer and a fourth charge trapping layer, respectively disposed at both sides of the second gate; and
      a doped region, disposed in both sides of the semiconductor layer and serving as a common source/drain region of both the first unit and the second unit.

2. The non-volatile memory as claimed in claim 1, wherein the material of the first, the second, the third, and the fourth charge trapping layer comprises nanocrystal, tantalum oxide, strontium titanate, or hafnium oxide.

3. The non-volatile memory as claimed in claim 1, wherein the material of the first, the second, the third, and the fourth charge trapping layer comprises silicon nitride.

4. The non-volatile memory as claimed in claim 1, wherein the material of the first, the second, the third, and the fourth charge trapping layer comprises silicon oxide/silicon nitride/silicon oxide (ONO) composite material.

5. The non-volatile memory as claimed in claim 1, wherein the first unit is disposed in the substrate, and a passivation layer is disposed between the first unit and the substrate.

6. The non-volatile memory as claimed in claim 1, wherein a dielectric layer is disposed on the substrate, and the first unit is disposed in the dielectric layer.

7. The non-volatile memory as claimed in claim 1 further comprising a plurality of memory cells arranged as a column/row array on the substrate.

8. The non-volatile memory as claimed in claim 1 further comprising a tunneling dielectric layer respectively disposed between the first unit and the semiconductor layer, and between the second unit and the semiconductor layer.

9. The non-volatile memory as claimed in claim 7, wherein the memory cells in the same column are disposed adjacently in mirror symmetry.

10. The non-volatile memory as claimed in claim 7 further comprising:
    a plurality of bottom word lines, arranged in parallel in a direction of the columns, for connecting the first gates of the memory cells in the same columns;
    a plurality of top word lines, arranged in parallel in the direction of the columns, for connecting the second gates of the memory cells in the same columns; and
    a plurality of bit lines, arranged in parallel in a direction of the rows, for connecting the doped regions of the memory cells in the same rows.

11. The non-volatile memory as claimed in claim 9, wherein two adjacent memory cells disposed in mirror symmetry share the doped region.

12. The non-volatile memory as claimed in claim 8, wherein the tunneling dielectric layer comprises a multi-layer structure.

13. The non-volatile memory as claimed in claim 12, wherein the multi-layer structure is a composite material of a bottom layer of silicon oxide/a middle layer of silicon nitride/a top layer of silicon oxide (ONO).

14. The non-volatile memory as claimed in claim 13, wherein the thickness of the bottom layer of silicon oxide in the composite material is less than 2 nm.

15. The non-volatile memory as claimed in claim 13, wherein the thickness of the bottom layer of silicon oxide in the composite material is between about 0.5~2 nm.

16. The non-volatile memory as claimed in claim 13, wherein the thickness of the bottom layer of silicon oxide in the composite material is less than 1.5 nm.

17. The non-volatile memory as claimed in claim 13, wherein the thickness of the middle layer of silicon nitride in the composite material is less than 2 nm.

18. The non-volatile memory as claimed in claim 13, wherein the thickness of the middle layer of silicon nitride in the composite material is between about 1~2 nm.

19. The non-volatile memory as claimed in claim 13, wherein the thickness of the top layer of silicon oxide in the composite material is less than 2 nm.

20. The non-volatile memory as claimed in claim 13, wherein the thickness of the top layer of silicon oxide in the composite material is between about 1.5~2 nm.

21. A manufacturing method of a non-volatile memory, comprising:
providing a substrate;
sequentially forming an insulation layer and a bottom conductive layer on the substrate;
forming a first dielectric layer on the substrate, the first dielectric layer having a first opening for exposing the bottom conductive layer;
forming a first unit in the first opening, the first unit comprising:
a first charge trapping layer and a second charge trapping layer, respectively formed on two sidewalls of the first opening; and
a first gate, filled the first opening and being electrically connected to the bottom conductive layer;
forming a second dielectric layer on the substrate, the second dielectric layer having a second opening for exposing the first unit;
forming a third dielectric layer in the second opening for covering the first unit;
forming a semiconductor layer in the second opening for covering the first unit, a lateral dimension of the semiconductor layer being greater than a lateral dimension of the first unit;
forming a second unit on the semiconductor layer, the second unit comprising:
a second gate, formed on the semiconductor layer; and
a third charge trapping layer and a fourth charge trapping layer, respectively formed at both sides of the second gate; and
forming a doped region in both sides of the semiconductor layer.

22. The manufacturing method as claimed in claim 21, wherein the substrate has a recess, and the insulation layer and the bottom conductive layer are sequentially formed in the recess to fill up the recess.

23. The manufacturing method as claimed in claim 21, wherein the method for forming the first unit comprises:
forming a charge trapping material layer in the opening;
removing a portion of the charge trapping material layer, for respectively forming the first charge trapping layer and the second charge trapping layer on two sidewalls of the opening and exposing a portion of the bottom conductive layer; and
filling up the first gate in the opening, connecting the first gate to the bottom conductive layer.

24. The manufacturing method as claimed in claim 21, wherein the method for forming the second unit comprises:

forming the second gate on the substrate;
forming a charge trapping material layer on the substrate; and
removing a portion of the charge trapping material layer, for respectively forming the third charge trapping layer and the fourth charge trapping layer at both sides of the second gate.

25. The manufacturing method as claimed in claim 21, wherein the method for forming the semiconductor layer comprises epitaxial lateral overgrowth.

26. The manufacturing method as claimed in claim 21, wherein the method for sequentially forming the insulation layer and the bottom conductive layer in the recess to fill up the recess comprises:
sequentially forming an insulation material layer and a conductor material layer on the substrate; and
removing portions of the insulation material layer and the conductor material layer through chemical mechanical polishing with the substrate as a stop layer.

27. The manufacturing method as claimed in claim 21, wherein the material of the first, the second, the third, and the fourth charge trapping layer comprises nanocrystal, tantalum oxide, strontium titanate, or hafnium oxide.

28. The manufacturing method as claimed in claim 21, wherein the material of the first, the second, the third, and the fourth charge trapping layer comprises silicon nitride.

29. The manufacturing method as claimed in claim 21, wherein the material of the first, the second, the third, and the fourth charge trapping layer comprises silicon oxide/silicon nitride/silicon oxide (ONO) composite material.

30. The manufacturing method as claimed in claim 21 further comprising a step of forming a top conductive layer on the second unit and electrically connecting the top conductive layer to the second gate.

31. The manufacturing method as claimed in claim 23 further comprising a step of forming a dielectric layer on inner walls of the first charge trapping layer and the second charge trapping layer before the step of forming the first gate.

32. The manufacturing method as claimed in claim 24 further comprising a step of forming a tunneling dielectric layer on the semiconductor layer before the step of forming the second gate.

33. The manufacturing method as claimed in claim 24 further comprising a step of forming a dielectric layer at both sides of the second gate before the step of forming the third charge trapping layer and the fourth charge trapping layer.

34. An operating method of a non-volatile memory, being suitable for a memory cell disposed on a substrate, the memory cell comprising: a first unit, comprising a first gate, a first charge trapping layer, and a second charge trapping layer, wherein the first charge trapping layer and the second charge trapping layer are disposed at both sides of the first gate; a semiconductor layer, covering the first unit; a second unit, disposed on the semiconductor layer and being in mirror symmetry to the first unit with the semiconductor layer as a symmetry axis, wherein the second unit comprises a second gate disposed on the semiconductor layer, and a third charge trapping layer and a fourth charge trapping layer disposed at both sides of the second gate; and a source region and a drain region, respectively disposed in the semiconductor layer at both sides of the second unit and used as the common source region and the common drain region of the first unit and the second unit, wherein the operating method comprising:
while performing a program operation, supplying a first voltage to the first gate, supplying a second voltage to the source region, supplying a third voltage to the drain region, supplying a fourth voltage to the second gate, and injecting charges into the first charge trapping layer, wherein the first voltage is higher than the second voltage, and the second voltage is higher than the third voltage and the fourth voltage.

35. The operating method as claimed in claim 34, wherein the mechanism of performing the program operation comprises channel hot electron injection.

36. The operating method as claimed in claim 34, wherein the first voltage is between 5V and 10V, the second voltage is between 3V and 6V, and the third voltage and the fourth voltage are both 0V.

37. The operating method as claimed in claim 34 further comprising:
while performing an erase operation, supplying a fifth voltage to the first gate, supplying a sixth voltage to the source region, supplying a seventh voltage to the drain region, supplying an eighth voltage to the second gate, and erasing charges in the first charge trapping layer, wherein the fifth voltage is lower than the sixth voltage, the seventh voltage and the eighth voltage, and the sixth voltage is higher than the seventh voltage and the eighth voltage.

38. The operating method as claimed in claim 34 further comprising:
while performing a read operation, supplying a ninth voltage to the first gate, supplying a tenth voltage to the source region, supplying an eleventh voltage to the drain region, supplying a twelfth voltage to the second gate, and reading a storage state of the first charge trapping layer, wherein the ninth voltage is higher than the eleventh voltage, and the eleventh voltage is higher than the tenth voltage and the twelfth voltage.

39. The operating method as claimed in claim 34 further comprising:
while performing a program operation, supplying the first voltage to the first gate, supplying the third voltage to the source region, supplying the second voltage to the drain region, supplying the fourth voltage to the second gate, and injecting charges into the second charge trapping layer through channel hot electron injection;
while performing an erase operation, supplying a fifth voltage to the first gate, supplying a seventh voltage to the source region, supplying a sixth voltage to the drain region, supplying an eighth voltage to the second gate, and erasing charges in the second charge trapping layer through BTBHH injection; and
while performing a read operation, supplying a ninth voltage to the first gate, supplying an eleventh voltage to the source region, supplying a tenth voltage to the drain region, supplying a twelfth voltage to the second gate, and reading the storage state of the second charge trapping layer through reverse reading.

40. The operating method as claimed in claim 34 further comprising:
while performing a program operation, supplying the fourth voltage to the first gate, supplying the second voltage to the source region, supplying the third voltage to the drain region, supplying the first voltage to the second gate, and injecting charges into the third charge trapping layer through channel hot electron injection;
while performing an erase operation, supplying an eighth voltage to the first gate, supplying a sixth voltage to the source region, supplying a seventh voltage to the drain region, supplying a fifth voltage to the second gate, and erasing charges in the third charge trapping layer through BTBHH injection; and
while performing a read operation, supplying a twelfth voltage to the first gate, supplying a tenth voltage to the source region, supplying an eleventh voltage to the drain region, supplying a ninth voltage to the second gate, and reading the storage state of the third charge trapping layer through reverse reading.

41. The operating method as claimed in claim 34 further comprising:
while performing a program operation, supplying the fourth voltage to the first gate, supplying the third voltage to the source region, supplying the second voltage to the drain region, supplying the first voltage to the second gate, and injecting charges into the fourth charge trapping layer through channel hot electron injection;
while performing an erase operation, supplying an eighth voltage to the first gate, supplying a seventh voltage to the source region, supplying a sixth voltage to the drain region, supplying a fifth voltage to the second gate, and erasing charges in the fourth charge trapping layer through BTBHH injection; and
while performing a read operation, supplying a twelfth voltage to the first gate, supplying an eleventh voltage to the source region, supplying a tenth voltage to the drain region, supplying a ninth voltage to the second gate structure, and reading the storage state of the fourth charge trapping layer through reverse reading.

42. The operating method as claimed in claim 37, wherein the mechanism of the erase operation includes band-to-band hot hole (BTBHH) injection.

43. The operating method as claimed in claim 37, wherein the fifth voltage is negative voltage and the sixth voltage is positive voltage.

44. The operating method as claimed in claim 37, wherein the fifth voltage is between −5V and −10V, the sixth voltage is between +3V and +6V, and the seventh voltage and the eighth voltage are both 0V.

45. The operating method as claimed in claim 38, wherein the mechanism of the read operation includes reverse reading.

46. The operating method as claimed in claim 38, wherein the ninth voltage is between 3V and 5V, the eleventh voltage is between 1V and 2V, and the tenth voltage and the twelfth voltage are both 0V.

47. A circuit system, comprising:
a non-volatile memory, comprising:
a plurality of memory cells, arranged as a column/row array, each memory cell comprises a first unit, a semiconductor layer, a second unit, and a doped region, wherein the first unit comprise a first gate, and a first charge trapping layer and a second charge trapping layer respectively disposed at both sides of the first gate; the semiconductor layer is disposed on the substrate and covering the first unit, the lateral dimension of the semiconductor layer being greater than the lateral dimension of the first unit; the second unit is disposed on the semiconductor layer, the second unit being in mirror symmetry to the first unit with the semiconductor layer as a symmetry axis, the second unit comprising a second gate disposed on the semiconductor layer; and a third charge trapping layer and a fourth charge trapping layer, respectively disposed at both sides of the second gate; the doped region is disposed in both sides of the semiconductor layer and serving as a common source/drain region of both the first unit and the second unit;
a plurality of word lines comprising: a plurality of bottom word lines arranged in parallel in a direction of the columns, for connecting the first gates of the memory cells in the same columns; and a plurality of top word lines, arranged in parallel in the direction of the columns, for connecting the second gates of the memory cells in the same columns; and a plurality of bit lines, arranged in parallel in a direction of the columns, for connecting the doped regions of the memory cells in the same columns; and a circuit, coupled to the non-volatile memory, comprising a column decoder, coupled to the bit lines;

a row decoder, coupled to the word lines; and a data-in structure, coupled to the column decoder, wherein a datum is stored in the non-volatile memory through the date-in structure.

48. The circuit system as claimed in claim 47, wherein the material of the first, the second, the third, and the fourth charge trapping layer comprises nanocrystal, tantalum oxide, strontium titanate, or hafnium oxide.

49. The circuit system as claimed in claim 47, wherein the material of the first, the second, the third, and the fourth charge trapping layer comprises silicon nitride.

50. The circuit system as claimed in claim 47, wherein the material of the first, the second, the third, and the fourth charge trapping layer comprises silicon oxide/silicon nitride/silicon oxide (ONO) composite material.

51. The circuit system as claimed in claim 47, wherein the semiconductor layer is formed through epitaxial lateral overgrowth.

52. The circuit system as claimed in claim 47, wherein the memory cells in the same column are disposed adjacently in mirror symmetry.

53. The circuit system as claimed in claim 47, wherein two adjacent memory cells disposed in mirror symmetry share the doped region.

* * * * *